(12) United States Patent
Kim et al.

(10) Patent No.: US 12,740,410 B2
(45) Date of Patent: Sep. 15, 2026

(54) SEMICONDUCTOR MODULE HAVING DOUBLE SIDED HEAT DISSIPATION STRUCTURE AND METHOD FOR FABRICATING THE SAME

(71) Applicant: LX SEMICON CO., LTD., Daejeon (KR)

(72) Inventors: Deog Soo Kim, Daejeon (KR); Tae Ryong Kim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 268 days.

(21) Appl. No.: 18/513,832

(22) Filed: Nov. 20, 2023

(65) Prior Publication Data

US 2024/0096730 A1 Mar. 21, 2024

(30) Foreign Application Priority Data

Sep. 21, 2022 (KR) ........................ 10-2022-0119240

(51) Int. Cl.
*H10W 40/22* (2026.01)
*H10W 70/40* (2026.01)
*H10W 74/10* (2026.01)
*H10W 90/00* (2026.01)
*H10W 90/20* (2026.01)

(52) U.S. Cl.
CPC ......... *H10W 40/22* (2026.01); *H10W 70/424* (2026.01); *H10W 74/114* (2026.01); *H10W 90/00* (2026.01); *H10W 70/442* (2026.01); *H10W 90/20* (2026.01); *H10W 90/288* (2026.01)

(58) Field of Classification Search
CPC .......................... H10W 40/00–80; B23K 3/085
See application file for complete search history.

(56) References Cited

U.S. PATENT DOCUMENTS 11,652,020 B2 * 5/2023 Chiu .................... H10W 40/22 361/783
2013/0154069 A1 6/2013 Kim et al.
2015/0264796 A1 * 9/2015 Neugirg ............. H10W 40/257 29/840
2021/0358876 A1 * 11/2021 Tzu .................... H10W 40/255

FOREIGN PATENT DOCUMENTS

JP 2019-083292 A 5/2019
KR 10-2013-0069109 A 6/2013

* cited by examiner

*Primary Examiner* — Christine S. Kim
*Assistant Examiner* — Cole Leon Lindsey
(74) *Attorney, Agent, or Firm* — ROTHWELL, FIGG, ERNST & MANBECK, P.C.

(57) ABSTRACT

A stacked semiconductor module having a double-sided heat dissipation structure according to one aspect of the present invention in which semiconductor dies may be arranged in a stacked structure with a heat dissipation substrate interposed there-between. The heat dissipation substrate includes a first heat dissipation substrate; a second heat dissipation substrate disposed below the first heat dissipation substrate to face the first heat dissipation substrate. The stacked semiconductor module includes a first semiconductor die module mounted between the first heat dissipation substrate and the second heat dissipation substrate; a third heat dissipation substrate disposed below the second heat dissipation substrate to face the second heat dissipation substrate; and a second semiconductor die module mounted between the second heat dissipation substrate and the third heat dissipation substrate.

20 Claims, 22 Drawing Sheets

(a)

(b)

(a)

(b)

(a)

(b)

SEMICONDUCTOR MODULE HAVING DOUBLE SIDED HEAT DISSIPATION STRUCTURE AND METHOD FOR FABRICATING THE SAME

CROSS-REFERENCE TO RELATED APPLICATIONS

The present application claims the benefits of priority to Korean Patent Application No. 10-2022-0119240, filed on Sep. 21, 2022, which is incorporated herein by reference in its entirety.

TECHNICAL FIELD

The present invention relates to a semiconductor module, and more specifically, to a semiconductor module having a double-sided heat dissipation structure.

BACKGROUND

Recently, as demand for semiconductors has increased in various fields, various research and developments are being conducted to improve semiconductor functions under specific conditions in addition to the main functions of semiconductors.

In general, a semiconductor module may include at least one semiconductor device in one package. In particular, in the case of a semiconductor module containing a semiconductor device whose physical properties may change due to an increase in heat generation due to high internal voltage and high current, a heat dissipation means may be included to dissipate heat. Semiconductor modules including the heat dissipation means can be divided into semiconductor modules with a single-sided heat dissipation structure and a semiconductor module with a double-sided heat dissipation structure.

In particular, the semiconductor module with a double-sided heat dissipation structure is known to be advantageous in terms of heat dissipation effectiveness because it can dissipate heat to both the top and bottom of each semiconductor device.

Since the semiconductor module with this double-sided heat dissipation structure has a semiconductor die mounted between two heat dissipation substrates, the number of semiconductor dies that can be mounted per unit area of the process is limited. Therefore, there is a limitation in that as the number of semiconductor dies that must be mounted increases, the required area inevitably increases.

SUMMARY

The present invention is intended to solve the above-mentioned problems, the technical object is to provide a stacked semiconductor module with a double-sided heat dissipation structure in which semiconductor dies can be arranged in a stacked structure with a heat dissipation substrate, and a method for manufacturing the same.

In addition, the present invention aims to provide a stacked semiconductor module with a double-sided heat dissipation structure that can increase the heat dissipation area of the heat dissipation substrate disposed between semiconductor dies arranged in a stacked structure, and a method of manufacturing the same.

In addition, another technical object of the present invention is to provide a stacked semiconductor module with a double-sided heat dissipation structure capable of forming a wiring layer of a semiconductor die through a Re-Distribution Layer (RDL) process and a manufacturing method thereof.

In order to achieve the above-described object, a stacked semiconductor module having a double-sided heat dissipation structure according to one aspect of the present invention may include a first heat dissipation substrate; a second heat dissipation substrate disposed below the first heat dissipation substrate to face the first heat dissipation substrate; a first semiconductor die module mounted between the first heat dissipation substrate and the second heat dissipation substrate; a third heat dissipation substrate disposed below the second heat dissipation substrate to face the second heat dissipation substrate; and a second semiconductor die module mounted between the second heat dissipation substrate and the third heat dissipation substrate.

In addition, a method of manufacturing a stacked semiconductor module with a double-sided heat dissipation structure according to another aspect of the present invention may include manufacturing a first semiconductor die module and a second semiconductor die module including at least one semiconductor die; mounting the first semiconductor die module between the first heat dissipation substrate and the second heat dissipation substrate, and mounting the second semiconductor die module between the second heat dissipation substrate and the third heat dissipation substrate; and forming a first molding member by injecting a molding material into each space between the first heat dissipation substrate and the second heat dissipation substrate and between the second heat dissipation substrate and the third heat dissipation substrate.

According to the present invention, the semiconductor dies may be disposed between the first heat dissipation substrate and the second heat dissipation substrate, and the second semiconductor die may be disposed between the second heat dissipation substrate and the third heat dissipation substrate. Therefore, since the first semiconductor die and the second semiconductor die may be arranged in a stacked structure with the first heat dissipation substrate, the number of semiconductor dies that can be mounted per unit area of the process increases, thereby reducing the area required to mount the same number of semiconductor dies.

In addition, according to the present invention, since the first auxiliary heat dissipation substrate extending from one side of the first heat dissipation substrate and the second auxiliary heat dissipation substrate extending from the other side of the first heat dissipation substrate may be exposed to the outside of the first molding member, the heat dissipation area of the first heat dissipation substrate can be increased, so that the effect of maximizing the heat dissipation effect of the semiconductor module.

In addition, according to the present invention, the wiring layer of the semiconductor die can be formed through the RDL process, so the spacer required in existing semiconductor modules can be eliminated. This has the effect of improving misalignment problems, deviation problems, flatness problems, and electrical connection defects caused by spacers.

BRIEF DESCRIPTION OF THE DRAWINGS

The accompanying drawings, which are incorporated herein and form part of the specification, illustrate various, non-limiting embodiments of the present invention. In the drawings, like reference numbers indicate identical or functionally similar elements.

DETAILED DESCRIPTION

Figure 1:
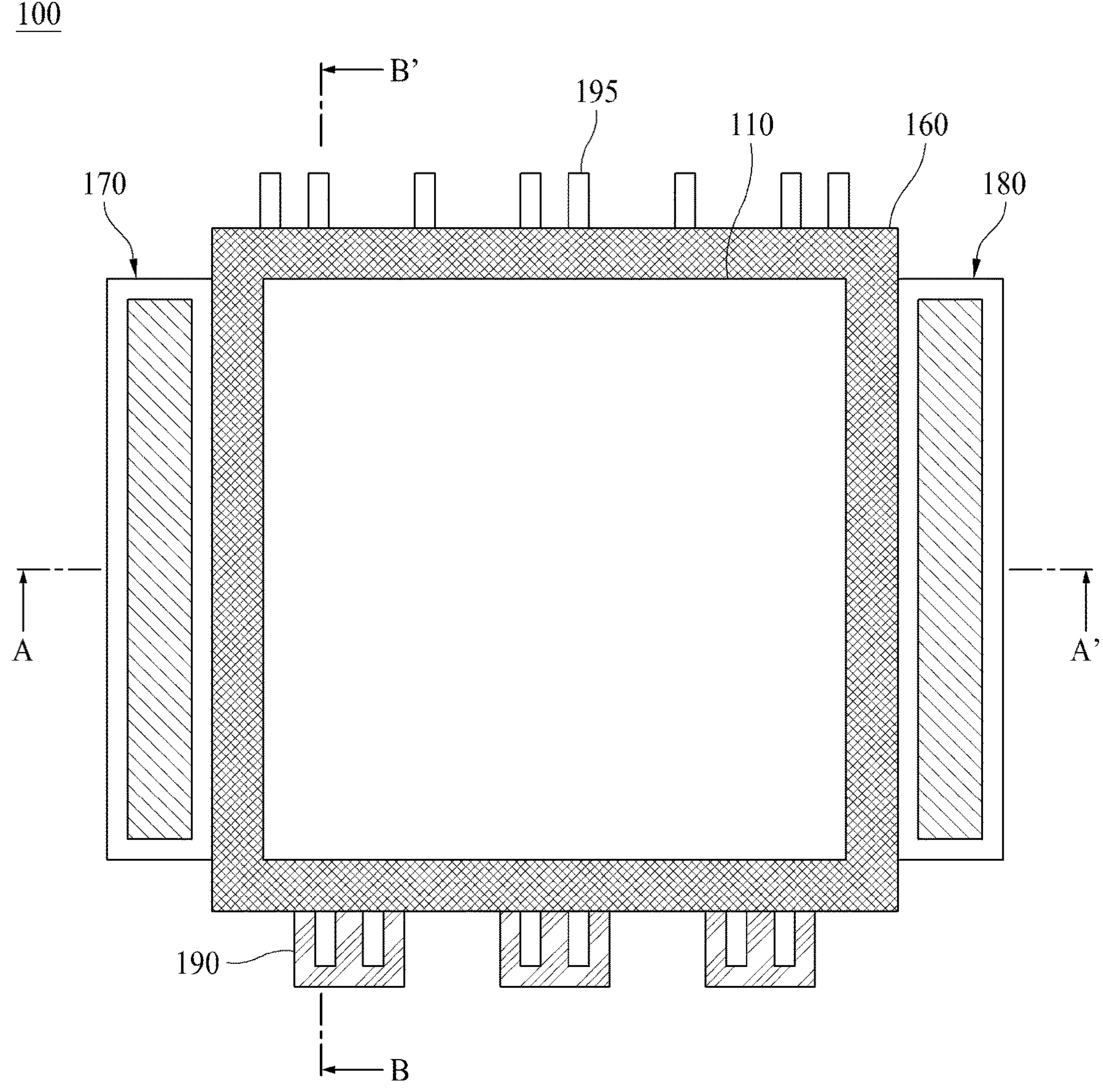
FIG. 1 is a plan view schematically showing the feature of a stacked semiconductor module with a double-sided heat dissipation structure according to a first embodiment of the present invention.

Throughout the specification, identical reference numbers refer to substantially identical elements. In the following description, detailed descriptions of features and functions known in the technical field of the present invention and cases not related to the core feature of the present invention may be omitted. The meaning of terms described in this specification should be understood as follows.

The advantages and features of the present invention and methods for achieving them will become clear by referring to the embodiments described in detail below along with the accompanying drawings. However, the present invention is not limited to the embodiments disclosed below and will be implemented in various different forms and only the present embodiments ensure that the disclosure of the present invention is complete. In addition, the present invention is provided to fully inform those skilled in the art of the present invention of the scope of the invention, and the present invention is only defined by the scope of the claims.

The shape, size, ratio, angle, number, etc. disclosed in the drawings for explaining embodiments of the present invention are illustrative, and the present invention is not limited to the matters shown. Identical reference signs refer to identical elements throughout the specification. Additionally, in describing the present invention, if it is determined that a detailed description of related known technologies may unnecessarily obscure the feature of the present invention, the detailed description will be omitted.

When ‘includes’, ‘has’, ‘consists of’, etc. mentioned in this specification are used, other parts may be added unless ‘only’ is used. When a element is expressed in the singular, the plural can be included unless specifically stated otherwise.

When interpreting elements, they are interpreted to include the margin of error even if there is no separate explicit description.

In the case of a description of a positional relationship, for example, when the positional relationship between two parts is described as ‘on top’, ‘on the top’, ‘on the bottom’, ‘next to’, etc. Unless ‘immediately’ or ‘directly’ is used, one or more other parts may be placed between the two parts.

In the case of a description of a temporal relationship, for example, if a temporal relationship is described as ‘after’, ‘before’, etc., ‘immediately’ or Non-consecutive cases can also be included unless ‘directly’ is used.

First, second, etc. are used to describe various elements, but these elements are not limited by these terms. These terms are merely used to distinguish one element from another. Accordingly, the first element mentioned below may also be the second element within the technical spirit of the present invention.

The term “at least one” should be understood to include all possible combinations from one or more related items. For example, “at least one of the first, second, and third items” means each of the first, second, or third items, as well as any combination of items that can be presented from two or more of the first, second, and third items.

Each feature of the various embodiments of the present invention can be partially or fully combined or combined with each other, various technical interconnections and operations are possible, and each embodiment may be implemented independently of each other or may be implemented together in a related relationship.

Hereinafter, embodiments of the present specification will be described in detail with reference to the attached drawings.

Figure 2:
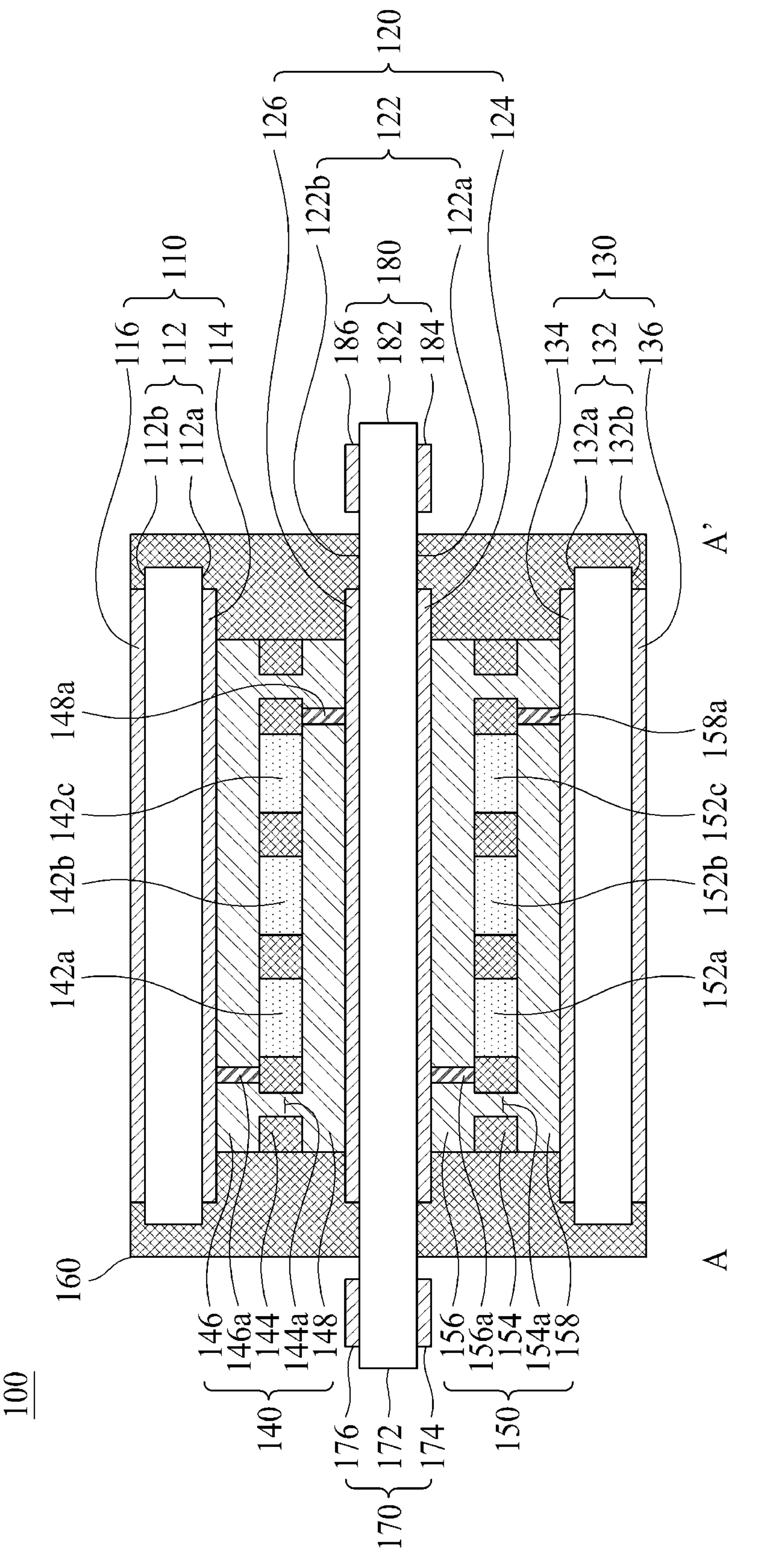
FIG. 2 is a cross-sectional view of the stacked semiconductor module having the double-sided heat dissipation structure shown in FIG. 1 cut along line A-A'.
Figure 3:
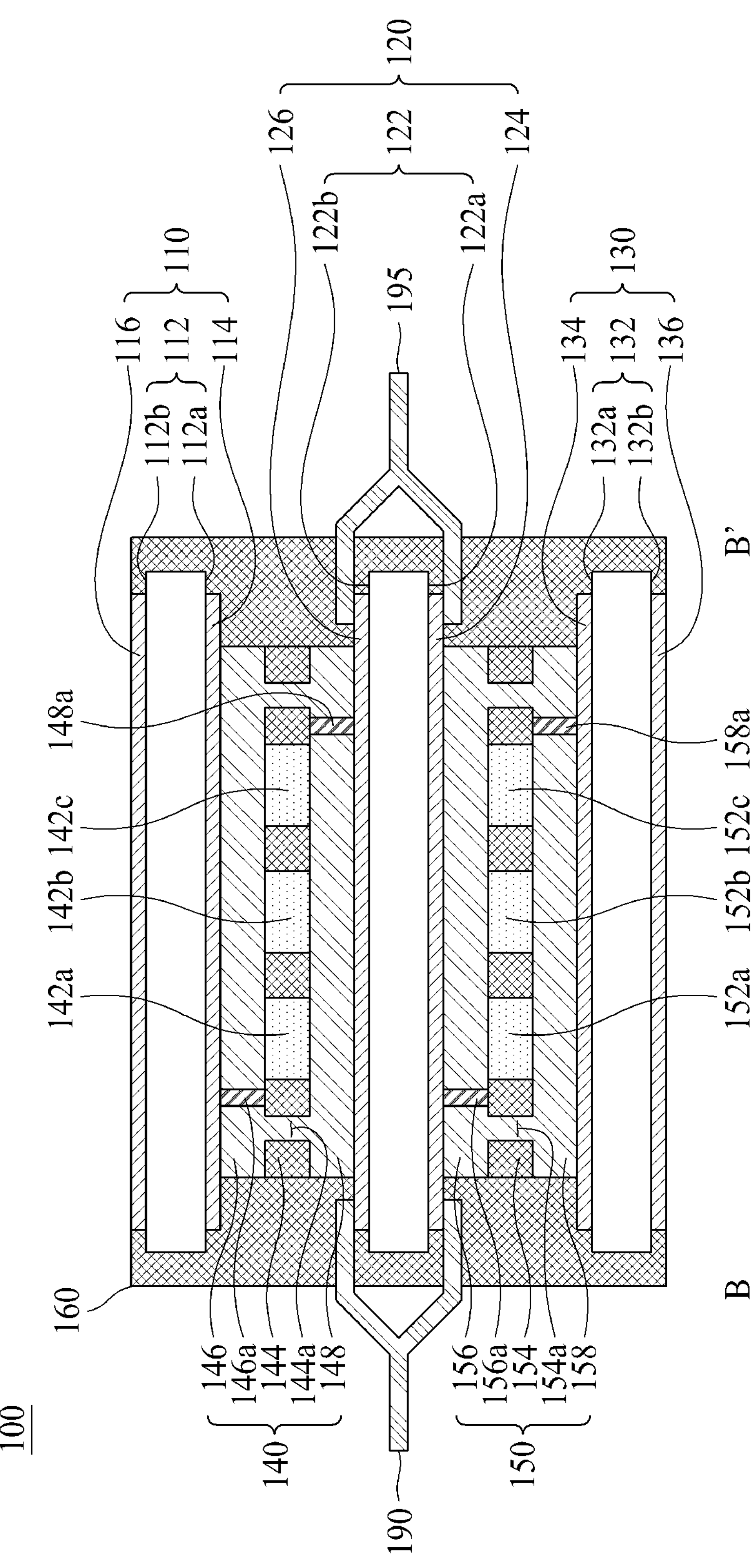
FIG. 3 is a drawing showing an example of a cross section of the stacked semiconductor module having the double-sided heat dissipation structure shown in FIG. 1 cut along line B-B'.

FIG. 1 is a plan view schematically showing the feature of a stacked semiconductor module with a double-sided heat dissipation structure according to the first embodiment of the present invention, FIG. 2 is a cross-sectional view of the stacked semiconductor module having a double-sided heat dissipation structure shown in FIG. 1 cut along line A-A', and FIG. 3 is a cross-sectional view of the stacked semiconductor module having a double-sided heat dissipation structure shown in FIG. 1 cut along line B-B'.

As shown in FIGS. 1 to 3, a stacked semiconductor module 100 having a double-sided heat dissipation structure according to the first embodiment of the present invention (herein after referred to as ‘stacked semiconductor module’) may include a first heat dissipation substrate 110, a second heat dissipation substrate 120, a third heat dissipation substrate 130, a first semiconductor die module 140, a second semiconductor die module 150, and a first molding member 160.

The first heat dissipation substrate 110 may radiate heat generated in the first semiconductor die module 140 to the outside. The first heat dissipation substrate 110 may include a first base plate 112, a first metal wiring layer 114, and a first heat dissipation metal layer 116.

The first base plate 112 may electrically insulate the first metal wiring layer 114 and the first heat dissipation metal layer 116. The first base plate 112 may include a ceramic material with high thermal conductivity.

The first metal wiring layer 114 may be formed on a first surface 112(*a*) of the first base plate 112 facing the second heat dissipation substrate 120. The first metal wiring layer 114 may be formed with a predetermined circuit wiring pattern.

One side of the first heat dissipation metal layer 116 may be coupled to a second surface 112(*b*) of the first base plate 112, and the other side of the first heat dissipation metal layer 116 may be dissipated heat to the outside. A heat dissipation means including a cooling medium may be disposed close to the other surface of the first heat dissipation metal layer 116.

The second heat dissipation substrate 120 may be disposed between the first heat dissipation substrate 110 and the third heat dissipation substrate 130. More specifically, the second heat dissipation substrate 120 may is disposed below the first heat dissipation substrate 110 and above the third heat dissipation substrate 130. Through this, the first semiconductor die module 140 may be mounted between the first heat dissipation substrate 110 and the second heat dissipation substrate 120, and the second semiconductor die module 150 may be mounted between the second heat dissipation substrate 120 and the third heat dissipation substrate 130.

The second heat dissipation substrate 120 may include a second base plate 122, a second metal wiring layer 124, and a third metal wiring layer 126.

The second base plate 122 may electrically insulate the second metal wiring layer 124 and the third metal wiring layer 126. The second base plate 122 may include a ceramic material with high thermal conductivity.

The second metal wiring layer 124 may be formed on a first surface 122*a* of the second base plate 122 facing the third heat dissipation substrate 130, and the third metal wiring layer 126 may be formed on a second surface 122*b* of second base plate 122 facing the first heat dissipation substrate 110. In one embodiment, predetermined circuit wiring patterns may be formed in the second metal wiring layer 124 and the third metal wiring layer 126.

In the case of the second heat dissipation substrate 120, unlike the first heat dissipation substrate 110 and the third heat dissipation substrate 130, it may not be exposed to the outside. In addition, since the first semiconductor die module 140 may is disposed on the upper side of the second heat dissipation substrate 120 and the second semiconductor die module 150 may is disposed on the lower side of the second heat dissipation substrate 120, a heat dissipation metal layer may not be formed. Instead, metal wiring layers 124 and 126 may be formed on both surfaces 122*a* and 122*b* of the second base plate 122.

The third heat dissipation substrate 130 may radiate heat generated in the second semiconductor die module 150 to the outside. The third heat dissipation substrate 130 may is disposed below the second heat dissipation substrate 120. The third heat dissipation substrate 130 may include a third base plate 132, a fourth metal wiring layer 134, and a second heat dissipation metal layer 136.

The third base plate 132 may electrically insulate the fourth metal wiring layer 134 and the second heat dissipation metal layer 136. The third base plate 142 may include a ceramic material with high thermal conductivity.

The fourth metal wiring layer 134 may be formed on a first surface 132*a* of the third base plate 132 facing the second heat dissipation substrate 120. The fourth metal wiring layer 134 may be formed with a predetermined circuit wiring pattern.

One side of the second heat dissipation metal layer 136 may be coupled to the second surface 132*b* of the third base plate 132, and the other side of the second heat dissipation metal layer 136 may radiate heat. A heat dissipation means including a cooling medium may be disposed close to the other surface of the second heat dissipation metal layer 136.

Meanwhile, in the above-described embodiment, in the case of the first heat dissipation substrate 110 and the third heat dissipation substrate 130, the first heat dissipation metal layer 116 and the second heat dissipation metal layer 136 may be exposed to the outside. But, since the second heat dissipation substrate 120 may is disposed between the first heat dissipation substrate 110 and the third heat dissipation substrate 130, the second heat dissipation substrate 120 cannot be exposed to the outside. For this reason, the heat dissipation performance of the second heat dissipation substrate 120 may be reduced, unlike the first heat dissipation substrate 110 and the third heat dissipation substrate 130.

Therefore, in order to improve the heat dissipation performance of the second heat dissipation substrate 120, the present invention may additionally include a first auxiliary heat dissipation substrate 170 and a second auxiliary heat dissipation substrate 180, as shown in FIG. 1.

The first auxiliary heat dissipation substrate 170 may extend from one side of the second heat dissipation substrate 120 to the outside of the first molding member 160 to increase the heat dissipation area of the second heat dissipation substrate 120, thereby improving the heat dissipation performance of the second heat dissipation substrate 120.

The first auxiliary heat dissipation substrate 170 may include a first auxiliary base plate 172, a first auxiliary heat dissipation metal layer 174, and a second auxiliary heat dissipation metal layer 176.

The first auxiliary base plate 172 may electrically insulate the first auxiliary heat dissipation metal layer 174 and the second auxiliary heat dissipation metal layer 176. The first auxiliary base plate 172 may include a ceramic material with high thermal conductivity. In one embodiment, the first auxiliary base plate 172 may be formed integrally with the second base plate 122. According to this embodiment, the first auxiliary base plate 172 may be formed to extend from one side of the second base plate 122 toward the outside of the first molding member 160.

The first auxiliary heat dissipation metal layer 174 may be coupled to one surface of the first auxiliary base plate 172 to dissipate heat to the outside, and the second auxiliary heat dissipation metal layer 176 may be coupled to the other surface of the first auxiliary base plate 172 to dissipate heat to the outside. The first auxiliary heat dissipating metal layer 174 may be formed together with the second metal wiring layer 124, and the second auxiliary heat dissipating metal layer 176 may be formed together with the third metal wiring layer 126. Heat dissipation means including a cooling medium may be disposed close to the first auxiliary heat dissipation metal layer 174 and the second auxiliary heat dissipation metal layer 176.

The second auxiliary heat dissipation substrate 180 may extend from the other side of the second heat dissipation substrate 120 to the outside of the first molding member 160 to increase the heat dissipation area of the second heat dissipation substrate 120, thereby improving the heat dissipation performance of the second heat dissipation substrate 120.

The second auxiliary heat dissipation substrate 180 may include a second auxiliary base plate 182, a third auxiliary heat dissipation metal layer 184, and a fourth auxiliary heat dissipation metal layer 186.

The second auxiliary base plate 182 may electrically insulate the third auxiliary heat dissipation metal layer 184 and the fourth auxiliary heat dissipation metal layer 186. The second auxiliary base plate 182 may include a ceramic material with high thermal conductivity. In one embodiment, the second auxiliary base plate 182 may be formed integrally with the second base plate 122. According to this embodiment, the second auxiliary base plate 182 may be formed to extend from the other side of the second base plate 122 toward the outside of the first molding member 160.

The third auxiliary heat dissipation metal layer 184 may be coupled to one surface of the second auxiliary base plate 182 to dissipate heat to the outside, and the fourth auxiliary heat dissipation metal layer 186 may be coupled to the other surface of the second auxiliary base plate 182 to dissipate heat to the outside. The third auxiliary heat dissipation metal layer 184 may be formed together with the second metal wiring layer 124, and the fourth auxiliary heat dissipation metal layer 186 may be formed together with the third metal wiring layer 126. Heat dissipation means including a cooling medium may be disposed close to the third auxiliary heat dissipation metal layer 184 and the fourth auxiliary heat dissipation metal layer 186.

As shown in FIG. 1, the first auxiliary heat dissipation substrate 170 and the second auxiliary heat dissipation substrate 180 may be formed to extend to the outside of the first molding member 160 from two of the four side of the second heat dissipation substrate 120 on which the lead frames 190 and 195 are not formed.

In this way, the stacked semiconductor module 100 according to the present invention may include a first auxiliary heat dissipation substrate 170 and a second auxiliary heat dissipation substrate 180 formed to be exposed to the outside of the first molding member 160. In addition, since heat dissipation means containing a cooling medium can be additionally disposed on the first auxiliary heat dissipation substrate 170 and the second auxiliary heat dissipation substrate 180, the heat dissipation performance of the stacked semiconductor module 100 can be maximized.

In the above-described embodiment, the first to fourth metal wiring layers 114, 124, 126 and 134, the first and second heat dissipation metal layers 116 and 136, and the first to fourth auxiliary heat dissipation metal layers 174, 176, 184 and 186 may include copper-based metal. According to this embodiment, the first to third heat dissipation substrates 110 to 130 and the first and second auxiliary heat dissipation substrates 170 and 180 may be formed using any one of the Direct Bonded Copper (DBC) method, the Active Material Brazing (AMB) method, and the Direct Plating Copper (DPC) method.

The first semiconductor die module 140 may be mounted between the first heat dissipation substrate 110 and the second heat dissipation substrate 120, and the second semiconductor die module 150 may be mounted between the second heat dissipation substrate 120 and the third heat dissipation substrate 130.

In one embodiment, the first semiconductor die module 140 may be coupled to the first heat dissipation substrate 110 and the second heat dissipation substrate 120 through an adhesive member (not shown), and the second semiconductor die module 150 may be coupled to the second heat dissipation substrate 120 and the third heat dissipation substrate 130 through an adhesive member. At this time, the adhesive member may be a Sn—Ag based adhesive member or an Ag based adhesive member. According to this embodiment, the first or second semiconductor die modules 140 or 150 may be coupled to the first to third heat dissipation substrates 110 to 130 through a soldering process or a sintering process.

The first semiconductor die module 140 may include one or more first semiconductor dies 142*a* to 142*c*, a second molding member 144, an upper wire rearrangement layer 146, and a lower wire rearrangement layer 148.

The first semiconductor dies 142*a* to 142*c* refer to semiconductor devices manufactured through a wafer-level process. In one embodiment, the semiconductor devices included in the first semiconductor dies 142*a* to 142*c* may be power semiconductor devices. The power semiconductor device can convert power supplied from a power supply such as a battery into power for driving a motor through a switching operation and supply it.

As an example, the first semiconductor die 142*a* to 142*c* may include a power semiconductor device such as a Gate Turn-Off thyristor (GTO), an Insulated Gate Bipolar Transistor (IGBT), or a Metal Oxide Semiconductor Field Effect Transistor (MOSFET) and may include semiconductor devices such as diodes.

Figure 4:
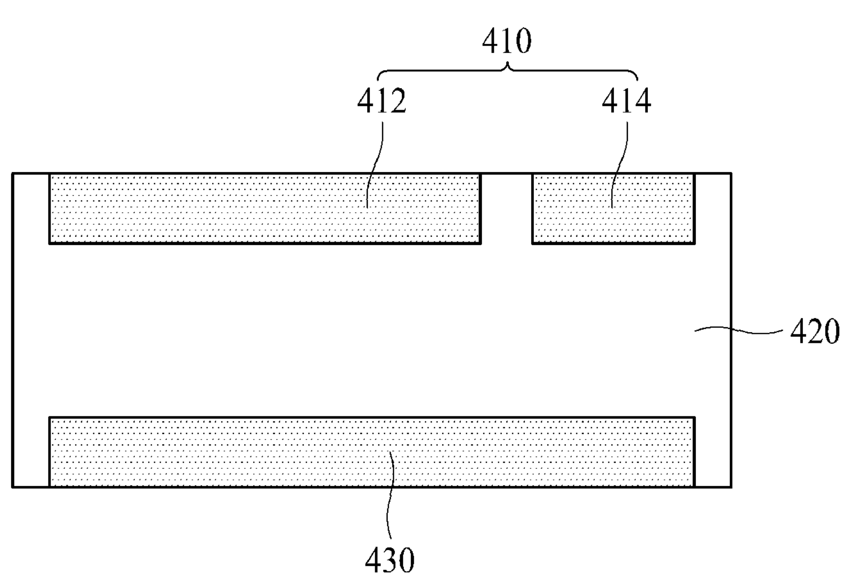
FIG. 4 is a drawing schematically showing the feature of the semiconductor die shown in FIGS. 2 and 3.

FIG. 4 is a drawing schematically showing the feature of a semiconductor die according to an embodiment of the present invention. As shown in FIG. 4, the first semiconductor die 142*a* to 142*c* according to an embodiment of the present invention may include a first electrode 410, a semiconductor layer 420, and a second electrode 430.

The first electrode 410 may is disposed on the semiconductor layer 420. In one embodiment, when the first semiconductor dies 142*a* to 142*c* may include a power semiconductor device such as a MOSFET, the first electrode 410 may include a gate electrode 412 and a source electrode 414. At this time, the gate electrode 412 and the source electrode 414 may be formed to be electrically isolated from each other. As another example, when the first semiconductor dies 142*a* to 142*c* may include a power semiconductor device such as an IGBT, the first electrode 410 may include a gate electrode 412 and an emitter electrode 414. At this time, the gate electrode 412 and the emitter electrode 414 may be formed to be electrically isolated from each other.

The second electrode 430 may is disposed below the semiconductor layer 420. In one embodiment, when the first semiconductor dies 142*a* to 142*c* may include a power semiconductor device such as a MOSFET, the second electrode 430 may include a drain electrode. As another example, when the first semiconductor dies 142*a* to 142*c* include a power semiconductor device such as an IGBT, the second electrode 430 may include a collector electrode.

In the above-described embodiment, the first electrode 410 may be formed of an Al-based metal, and the second electrode 430 may be formed of a Ti/Ni/Ag metal including a Ti layer, a Ni layer, and an Ag layer or may be formed of NiV/Ag, V (vanadium)/Ni/Ag, etc., and the semiconductor layer 420 may be formed of SiC (Silicon Carbide).

In one embodiment, when the first semiconductor die module 140 may include a plurality of first semiconductor dies 142*a* to 142*c*, the plurality of first semiconductor dies 142*a* to 142*c* may all include the same type of semiconductor device. As another example, some of the plurality of first semiconductor dies 142*a* to 142*c* may be implemented with different types of semiconductor devices.

In the above-described embodiment, when the first semiconductor die module 140 may include a plurality of first semiconductor dies 142*a* to 142*c*, some of the first semiconductor dies 142*a* to 142*c* may be arranged such that the first electrode 410 faces upward and the second electrode 430 faces downward, the rest of the first semiconductor dies 142*a* to 142*c* may be arranged so that the first electrode 410 faces downward and the second electrode 430 faces upward.

In another embodiment, the first semiconductor dies 142_a_ to 142_c_ may be disposed between the first and second heat dissipation substrates 110 and 120 so that all the same electrodes face the same direction. For example, the first electrodes 410 of the first semiconductor dies 142_a_ to 142_c_ may all face upward, and the second electrodes 430 of the first semiconductor dies 142_a_ to 142_c_ may all face downward. As another example, the first electrodes 410 of the first semiconductor dies 142_a_ to 142_c_ may all face downward, and the second electrodes 430 of the first semiconductor dies 142_a_ to 142_c_ may all face upward.

In FIGS. 1 to 3, the first semiconductor die module 140 is shown as including three first semiconductor dies 142_a_ to 142_c_, but this is only an example. The number of first semiconductor dies 142_a_ to 142_c_ may vary depending on the type of application in which the stacked semiconductor module 100 according to the present invention is used.

The second molding member 144 can protect the first semiconductor dies 142_a_ to 142_c_ from oxidizing substances and can function to fix the first semiconductor dies 142_a_ to 142_c_. The second molding member 144 may be formed to expose the upper and lower surfaces of the first semiconductor dies 142_a_ to 142_c_ and may surround the side surfaces of the first semiconductor dies 142_a_ to 142_c_. That is, the second molding member 144 may not be disposed on the upper and lower sides of the first semiconductor dies 142_a_ to 142_c_, but may is disposed only on the sides of the first semiconductor dies 142_a_ to 142_c_. Through this, the first electrode 410 or the second electrode 430 of the first semiconductor die 142_a_ to 142_c_ may be exposed to the upper and lower sides and can be electrically connected to the wirings disposed in the upper and lower wire rearrangement layers 146 and 148.

In one embodiment, the second molding member 144 may be formed of EMC (Epoxy Molding Compound).

A via hole 144_a_ filled with a conductive material may be formed in the second molding member 144. In one embodiment, the via hole 144_a_ may be formed in the second molding member 144 through a drilling process. At this time, the conductive material filled in the via hole 144_a_ may be the same material that forms the upper wire rearrangement layer 146 or the lower wire rearrangement layer 148. The upper wire rearrangement layer 146 and the lower wire rearrangement layer 148 may be electrically connected through the via hole 144_a_.

The upper wire rearrangement layer 146 may is disposed on the upper surface of the second molding member 144 and the first semiconductor dies 142_a_ to 142_c_. A first wires may be disposed in the upper wire rearrangement layer 146. The first wires may electrically connect upwardly exposed electrodes among the electrodes of the first semiconductor dies 142_a_ to 142_c_. For example, when the first semiconductor die 142_a_ may be arranged so that the first electrode 410 may be located on the upper side and the first semiconductor die 142_b_ may be arranged so that the second electrode 430 may be located on the upper side, any one of the first wires may electrically connect the first electrode 410 of the first semiconductor die 142_a_ and the second electrode 430 of the first semiconductor die 142_b_. The first wires may electrically connect upwardly exposed electrodes among the electrodes of the first semiconductor dies 142_a_ to 142_c_ with the lead frames 190 and 195.

In one embodiment, the first wires may be made of copper-based metal. Among the first wires, wires that are insulated from each other may be physically separated by the first insulating member 146_a_. The first insulating member 146_a_ may be formed of a Photo Resistor.

The lower wire rearrangement layer 148 may is disposed on the lower surfaces of the second molding member 144 and the first semiconductor dies 142_a_ to 142_c_. A second wires may be disposed in the lower wire rearrangement layer 148. The second wires may electrically connect the electrodes exposed to the lower side among the electrodes of the first semiconductor dies 142_a_ to 142_c_. For example, when the first semiconductor die 142_a_ may is disposed so that the second electrode 430 may be located on the lower side, and the first semiconductor die 142_b_ may is disposed so that the first electrode 410 may be located on the lower side, one of the second wires may electrically connect the second electrode 430 of the first semiconductor die 142_a_ and the first electrode 410 of the first semiconductor die 142_b_. The second wires may electrically connect the electrodes exposed to the lower side among the electrodes of the first semiconductor dies 142_a_ to 142_c_ with the lead frames 190 and 195.

In one embodiment, the second wires may be made of copper-based metal. Among the second wires, wires that are insulated from each other may be physically separated by the second insulating member 148_a_. The second insulating member 148_a_ may be formed of a Photo Resistor.

In the above-described embodiment, at least some of the first wires of the upper wire rearrangement layer 146 and at least some of the second wires of the lower wire rearrangement layer 148 may be electrically connected through the via hole 144_a_ formed in the first molding member 144.

Meanwhile, as shown in FIGS. 2 and 3, the first semiconductor dies 142_a_ to 142_c_ included in the first semiconductor die module 140 may be mounted in a predetermined area between the first heat dissipation substrate 110 and the second heat dissipation substrate 120, the second semiconductor dies 152_a_ to 152_c_ included in the second semiconductor module 150 may be disposed in an area corresponding to the predetermined area between the second heat dissipation substrate 120 and the third heat dissipation substrate 130. With the above-described structure, the first semiconductor dies 142_a_ to 142_c_ included in the first semiconductor die module 140 and the second semiconductor dies 152_a_ to 152_c_ included in the second semiconductor die module 150 may be formed in a stacked structure with the second heat dissipation substrate 120 interposed there between.

The second semiconductor die module 150 may include one or more second semiconductor dies 152_a_ to 152_c_, a second molding member 154, an upper wire rearrangement layer 156, and a lower wire rearrangement layer 158. Since the second semiconductor dies 142_a_ to 142_c_, the second molding member 144, the upper wire rearrangement layer 156, and the lower wire rearrangement layer 158 may have the same function as the first semiconductor dies 142_a_ to 142_c_, the second molding member 154, the upper wire rearrangement layer 146 and the lower wire rearrangement layer 148, detailed description will be omitted.

In this way, according to the present invention, since the first semiconductor die 142_a_ to 142_c_ of the first semiconductor die module 140 and the second semiconductor die 152_a_ to 152_c_ of the second semiconductor die module 150 may be arranged in a stacked structure with the second heat dissipation substrate in between, the number of semiconductor dies that can be mounted per unit area of the process increases, reducing the area required to mount the same number of semiconductor dies.

The first molding member 160 may be formed in the space between the first heat dissipation substrate 110 and the second heat dissipation substrate 120 and the space between the second heat dissipation substrate 120 and the third heat dissipation substrate 130. The first molding member 160 may be formed by injecting molding materials into the space between the first heat dissipation substrate 110 and the second heat dissipation substrate 120 and the space between the second heat dissipation substrate 120 and the third heat dissipation substrate 130. In one embodiment, the molding material may be EMC.

The first molding member 160 may increase the insulating distance between the first and second heat dissipation substrates 110 and 120 and the insulating distance between the second and third heat dissipation substrates 120 and 130. The first molding member 160 may protect the first and second semiconductor dies 142*a* to 142*c* and 152*a* to 152*c* included in the first and second semiconductor die modules 140 and 150 from oxidizing substances. The first molding member 160 may perform the function of fixing the first and second semiconductor dies 142*a* to 142*c* and 152*a* to 152*c*.

Meanwhile, as shown in FIGS. 1 and 3, the stacked semiconductor module 100 according to the present invention may further include a lead frames 190 and 195. The lead frames 190 and 195 may include a first lead frame 190 connected to one side of the second heat dissipation substrate 120 and a second lead frame 195 connected to the other side of the second heat dissipation substrate 120.

One end of the first lead frame 190 may be electrically connected to the second metal wiring layer 124 and the third metal wiring layer 126 on one side of the second heat dissipation substrate 120, and the other end may be exposed to the outside of the first molding member 160 and is connected to an external connection terminal (not shown).

One end of the second lead frame 195 may be electrically connected to the second metal wiring layer 124 and the third metal wiring layer 126 on the other side of the second heat dissipation substrate 120, and the other end may be exposed to the outside of the first molding member 160 and is connected to an external connection terminal.

In the above-described embodiment, the first lead frame 190 and the second lead frame 195 may be connected to different electrodes of the first and second semiconductor dies 142*a* to 142*c* and 152*a* to 152*c*. And the external connection terminal can be electrically connected to a motor, input power, inverter controller, etc.

Figure 5:
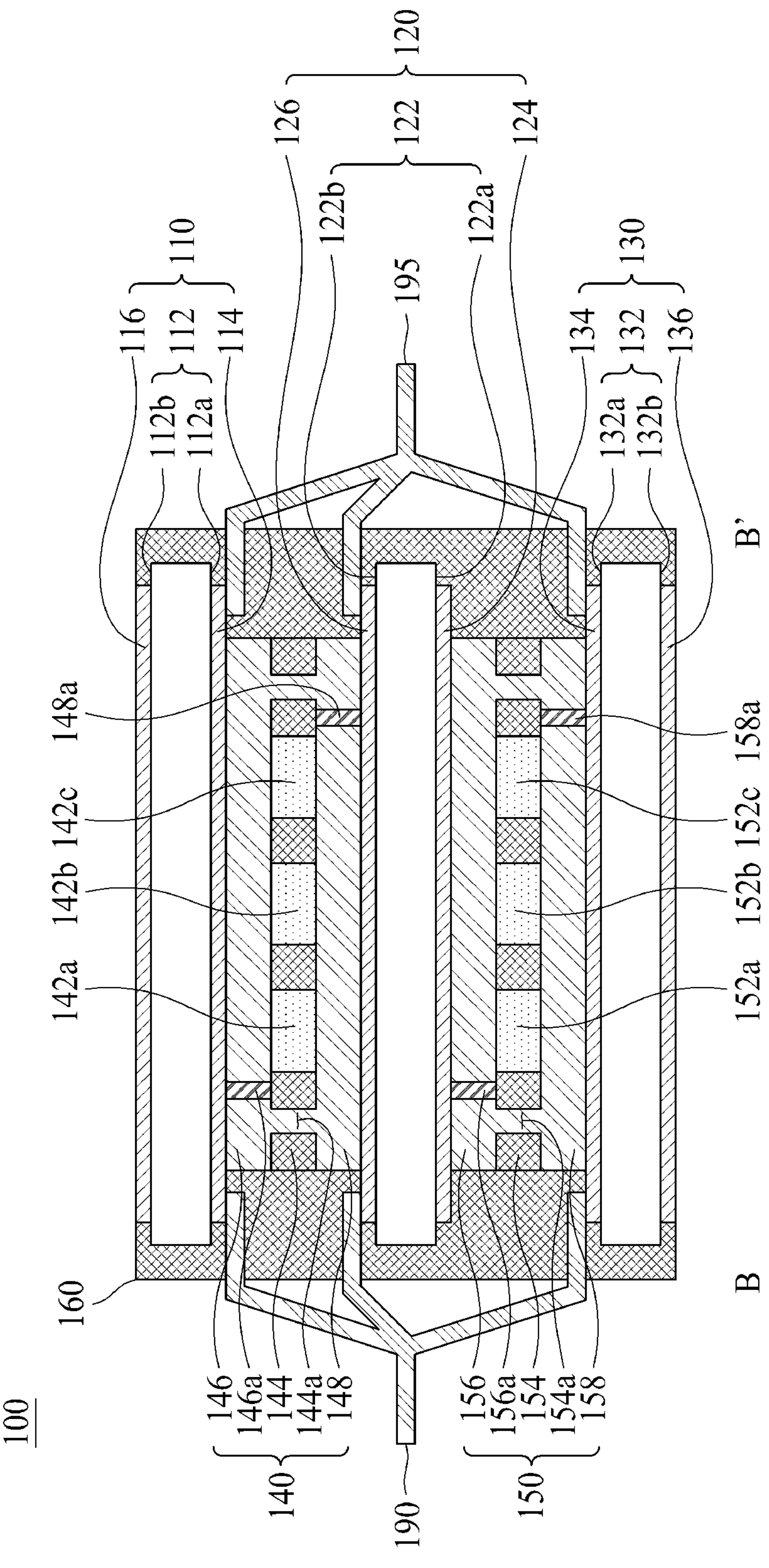
FIG. 5 is a drawing showing another example of a cross section of the stacked semiconductor module having the double-sided heat dissipation structure shown in FIG. 1 cut along line B-B'.

In FIG. 3, the lead frames 190 and 195 are shown as being connected to only one side and the other side of the second heat dissipation substrate 120. However, in another embodiment, as shown in FIG. 5, one end of the lead frames 190, 195 may be electrically connected to the first metal wiring layer 114 of the first heat dissipation substrate 110, the third metal wiring layer 126 of the second heat dissipation substrate 120, and the fourth metal wiring layer 134 of the third heat dissipation substrate 130. In addition, the other ends of the lead frames 190 and 195 may be exposed to the outside of the first molding member 160 and may be connected to external connection terminals.

Figure 6:
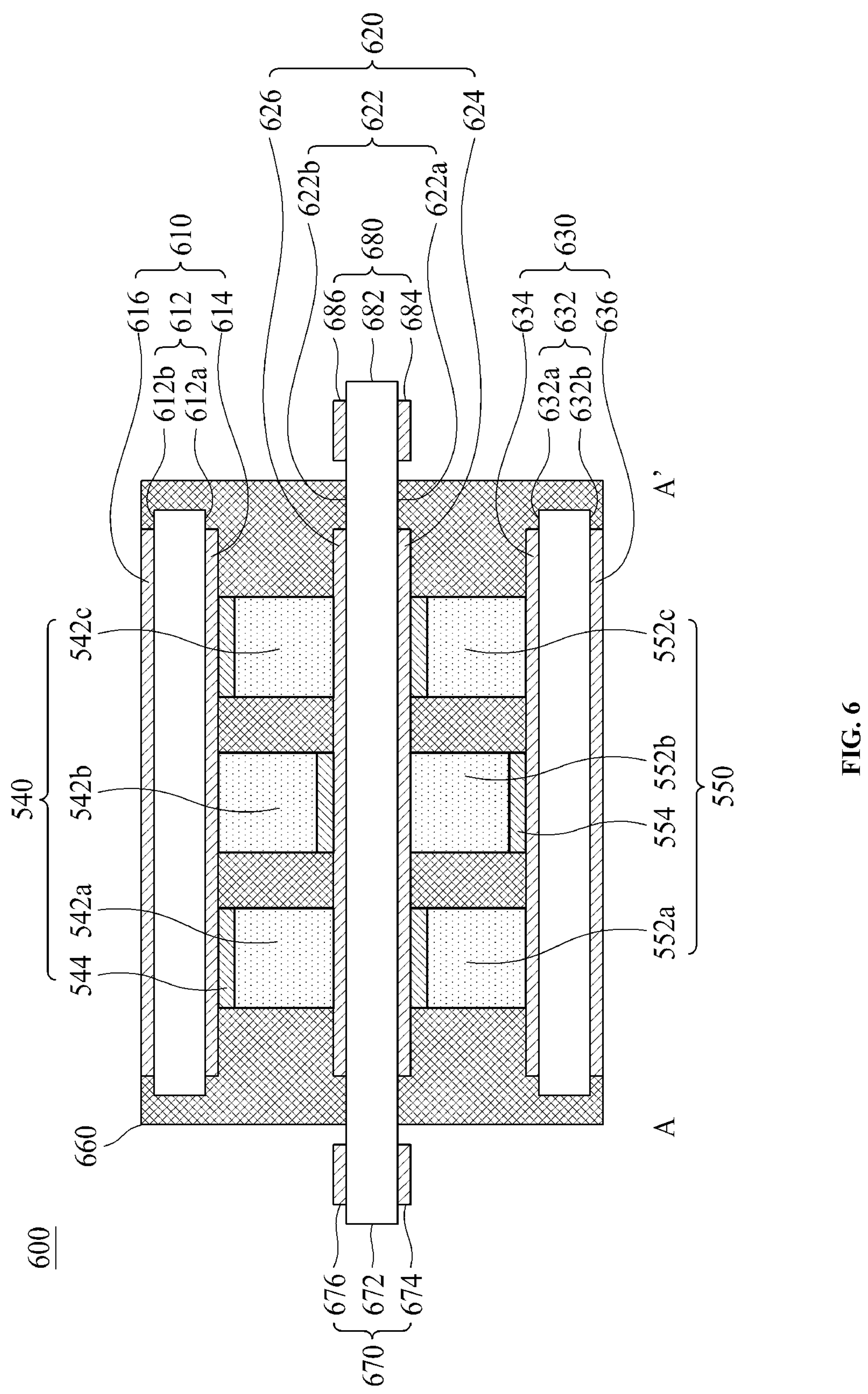
FIG. 6 is a cross-sectional view of a stacked semiconductor module having a double-sided heat dissipation structure according to the second embodiment of the present invention cut along line A-A'.
Figure 7:
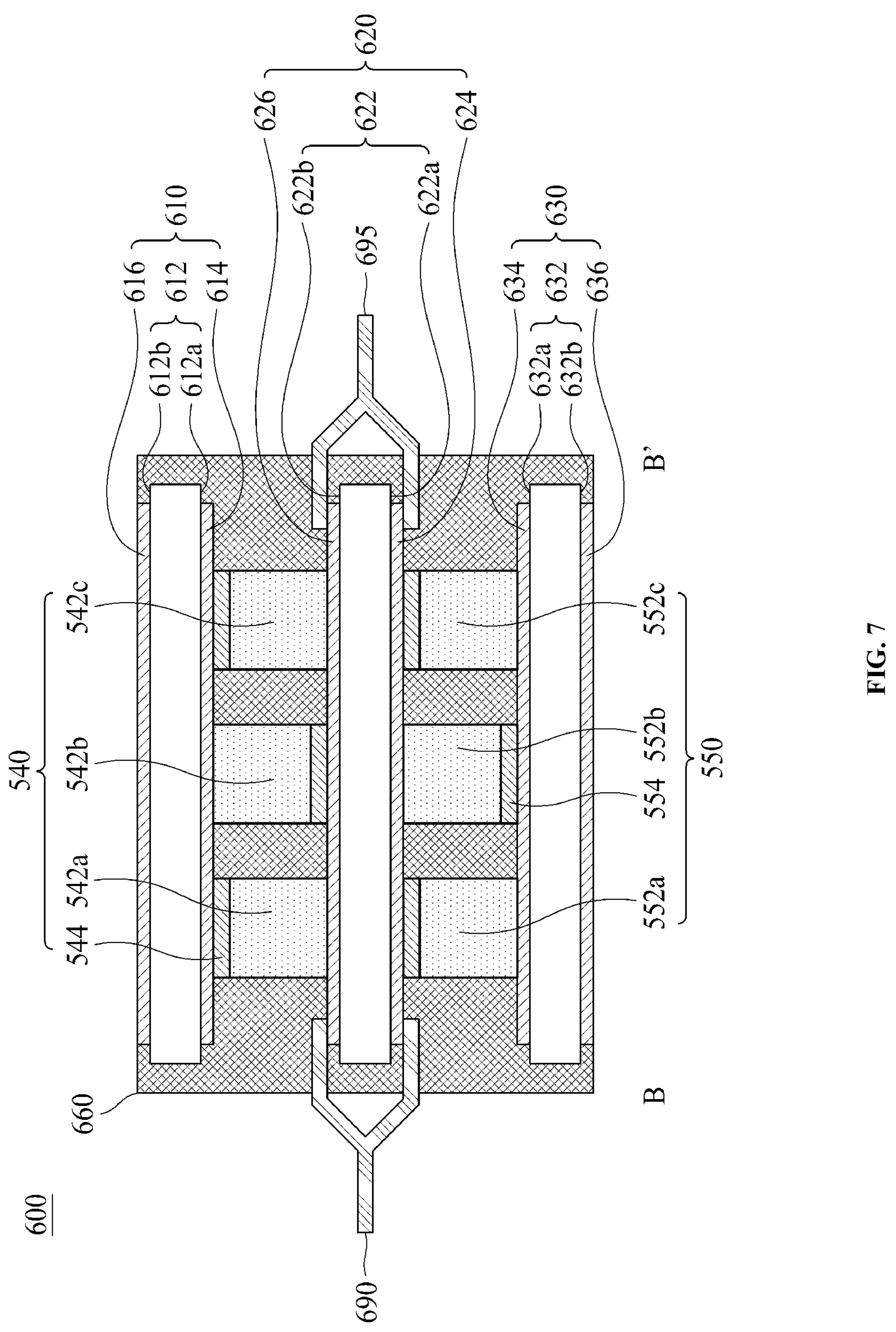
FIG. 7 is a cross-sectional view of a stacked semiconductor module with the double-sided heat dissipation structure according to the second embodiment of the present invention cut along line B-B'.

FIGS. 6 and 7 are drawings schematically showing the feature of a stacked semiconductor module with a double-sided heat dissipation structure according to a second embodiment of the present invention. The stacked semiconductor module with a double-sided heat dissipation structure as shown in FIGS. 6 and 7 may have the same feature as stacked semiconductor module 100 having a double-sided heat dissipation structure according to the first embodiment except that the first semiconductor die module 540 and the second semiconductor die module 550 have different features. Thus, hereinafter, for convenience of explanation, only the feature of the first semiconductor die module 540 and the second semiconductor die module 550 will be described.

The first semiconductor die module 540 may include one or more first semiconductor dies 542*a* to 542*c* and a first spacer 544.

Since the first semiconductor dies 542*a* to 542*c* may be the same as the first semiconductor dies 142*a* to 142*c* according to the first embodiment, detailed descriptions are omitted.

The first spacer 544 may be coupled to one surface of the first semiconductor die 542*a* to 542*c* to maintain the separation distance between the first heat dissipation substrate 110 and the second heat dissipation substrate 120. In one embodiment, the first spacer 544 may be formed of a conductive material. For example, the first spacer 544 may be formed of copper-molybdenum (Cu—Mo).

One surface of the first spacer 544 may be coupled to the first semiconductor dies 542*a* to 542*c* of the first semiconductor die module 540 using the adhesive member, and the other surface of the first spacer 544 may be coupled to the first heat dissipation substrate 100 or the second heat dissipation substrate 120 using the adhesive member. In one embodiment, the adhesive member may be a Sn—Ag based adhesive member or an Ag based adhesive member, and the first spacer 544 may be coupled to the first semiconductor die 542*a* to 542*c*, the first heat dissipation substrate 110, or the second heat dissipation substrate 120 through a soldering method or a sintering method.

In one embodiment, when the first semiconductor die module 540 may include a plurality of first semiconductor dies 542*a* to 542*c*, some of the first semiconductor dies 542*a* to 542*c* may be arranged so that the first electrode 410 faces upward and the second electrode 430 faces downward, and the remaining of the first semiconductor dies 542 to 542*c* may be arranged so that the first electrode 410 faces downward and the second electrode 430 faces upward.

According to this embodiment, the first spacer 544 may be coupled to the surface of the first semiconductor die 542*a* to 542*c* where the first electrode 410 may be formed. Alternatively, the first spacer 544 may be coupled to the surface of the first semiconductor die 542*a* to 544*c* where the second electrode 410 may be formed.

In another embodiment, the first semiconductor dies 542*a* to 542*c* may be disposed between the first and second heat dissipation substrates 510 and 520 so that all the same electrodes may face the same direction. For example, the first electrodes 410 of the first semiconductor dies 542*a* to 542*c* may all face upward, and the second electrodes 430 of the first semiconductor dies 542*a* to 542*c* may all face downward. As another example, the first electrodes 410 of the first semiconductor dies 542*a* to 542*c* may all face downward, and the second electrodes 430 of the first semiconductor dies 542*a* to 542*c* may all face upward.

According to this embodiment, the first spacer 544 may be coupled to the surface of the first semiconductor die 542*a* to 542*c* where the first electrode 410 may be formed. Alternatively, the first spacer 544 may be coupled to the surface of the first semiconductor die 542*a* to 544*c* where the second electrode 410 may be formed.

The second semiconductor die module 550 may include one or more second semiconductor dies 552*a* to 552*c* and a second spacer 554. When comparing the one or more second semiconductor dies 552*a* to 552*c* and the second spacer 554 with the first semiconductor dies 542*a* to 542*c* and the first spacer 544, the only difference is that it is disposed between the second heat dissipation substrate 120 and the third heat dissipation substrate 130, and since it may be the same as the first semiconductor die 542*a* to 542*c* and the first spacer 544, detailed description will be omitted.

Figure 8:
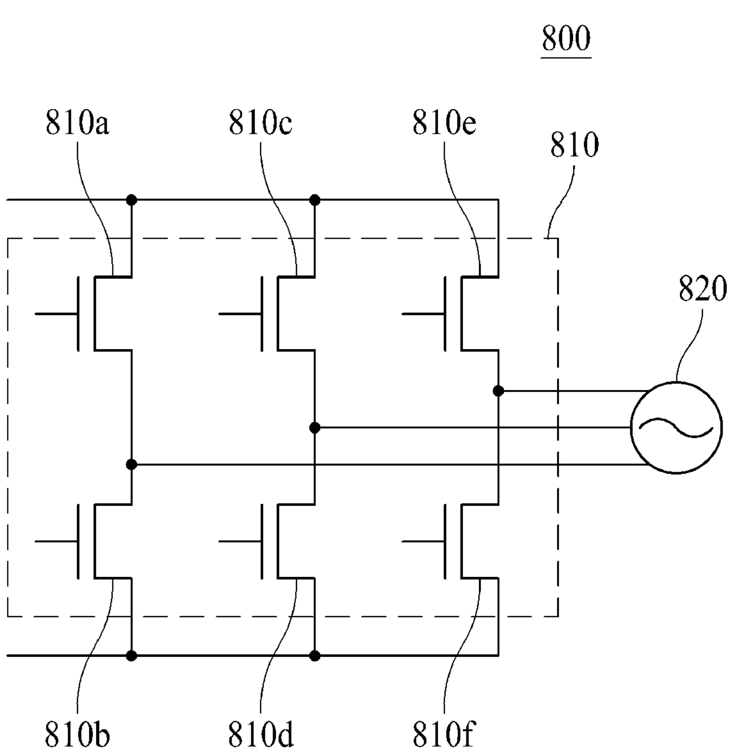
FIG. 8 is a schematic circuit drawing of a power device to which a semiconductor module with a double-sided heat dissipation structure is applied according to an embodiment of the present invention.

FIG. 8 is a schematic circuit diagram of a power device to which the stacked semiconductor module having a double-sided heat dissipation structure shown in FIGS. 1 to 7. As shown in FIG. 8, the power device 800 may include an inverter 810 and a motor 820.

The inverter 810 may supply AC power to the motor 820. The inverter 810 can receive DC (Direct Current) power from a battery or fuel cell, convert it into AC power, and then output the converted AC power to the motor 820. As shown in FIG. 8, the inverter 810 may include six semiconductor dies 810(*a*) to 810*f*, and by configuring the stacked semiconductor modules 100 and 600 according to FIGS. 1 and 7 to include six semiconductor dies, the stacked semiconductor modules 100 and 600 according to the present invention can perform the function of the inverter 810 of the power device 800.

The motor 820 provides power to electric vehicles, fuel cell vehicles, etc. The motor 820 may be driven by receiving three-phase AC (Alternating Current) power.

Hereinafter, a method for manufacturing a stacked semiconductor module with a double-sided heat dissipation structure according to the first embodiment of the present invention will be described with reference to FIGS. 9 to 16B.

Figure 9:
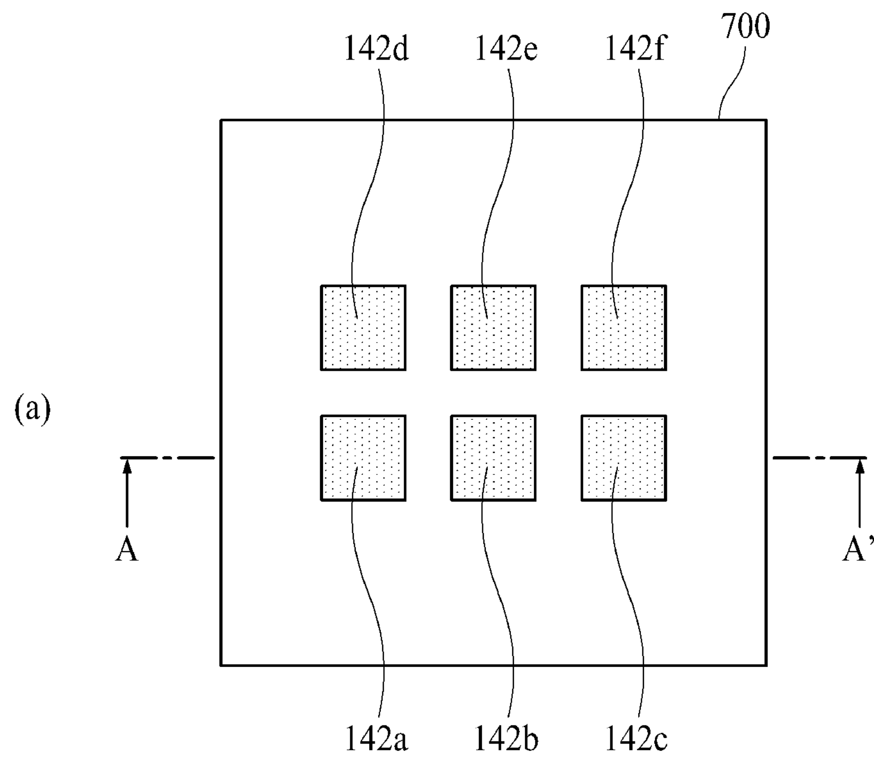
FIGS. 9 to 16B are drawings showing a method of manufacturing a stacked semiconductor module with a double-sided heat dissipation structure according to the first embodiment of the present invention.
Figure 9:
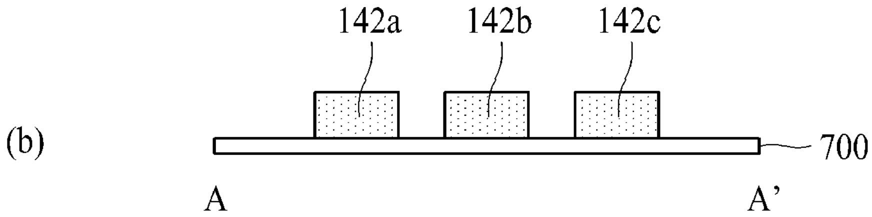

FIGS. 9(*a*), 10(*a*), 11(*a*), 12(*a*), and 13(*a*) show a method of manufacturing a stacked semiconductor module having a double-sided heat dissipation structure (hereinafter referred to as 'stacked semiconductor module') according to the first embodiment of the present invention. FIGS. 9(*b*), 10(*b*), 11(*b*), 12(*b*), 13(*b*), and 14 to 16B are schematic cross-sectional process views showing a method of manufacturing a stacked semiconductor module according to a first embodiment of the present invention.

First, with reference to FIGS. 9 to 13, a method of manufacturing the first semiconductor die module will be described. Referring to FIGS. 9(*a*) and 9(*b*), first semiconductor dies 142*a* to 142*f* are placed on the carrier film 700 at predetermined positions. As shown in FIGS. 9(*a*) and 9(*b*), six semiconductor dies 142*a* to 142*f* are shown to be disposed on the carrier film 700, but this is only an example, and the number of semiconductor dies may vary depending on the type of application to which the stacked semiconductor module according to the present invention is applied.

In one embodiment, the plurality of first semiconductor dies 142*a* to 142*f* may include power semiconductor devices. At this time, some (142*a*, 142*d*, 142*c*, 142*f*) and remaining (142*b*, 142*e*) of the first semiconductor dies 142*a* to 142*f* may be arranged in opposite directions.

Figure 10:
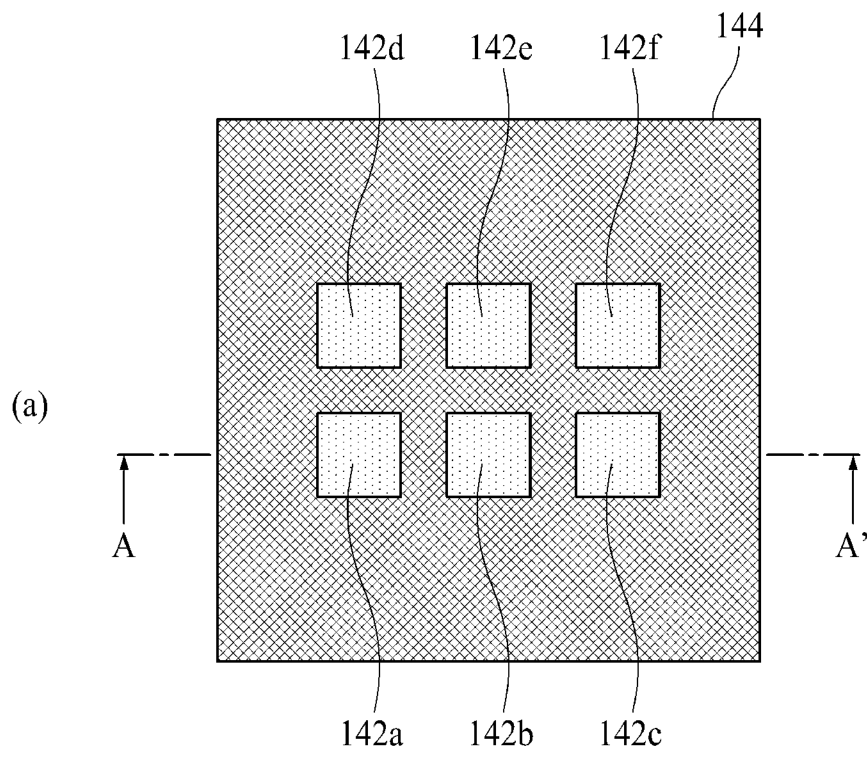
Figure 10:
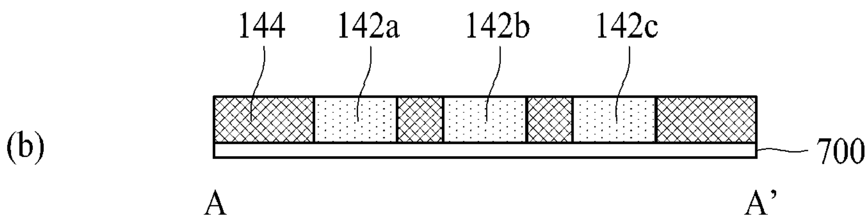

Thereafter, as shown in FIGS. 10(*a*) and 10(*b*), the second molding member 144 surrounding the side surfaces of the first semiconductor dies 142*a* to 142*f* may be formed on the carrier film 700. That is, the second molding member 144 is not formed on the upper and lower surfaces of the first semiconductor dies 142*a* to 142*f*, but the second molding member 144 may be formed only on the side surfaces of the first semiconductor dies 142*a* to 142*f*, both the first electrode 410 and the second electrode 430 formed on the upper and lower surfaces of the first semiconductor dies 142*a* to 142*f* may be exposed to the outside. The positions of the first semiconductor dies 142*a* to 142*f* may be fixed by the second molding member 144.

In one embodiment, the second molding member 144 may be formed of EMC, and the second molding member 144 may be formed by injecting EMC into the surroundings of the first semiconductor dies 142*a* to 142*f*.

Figure 11:
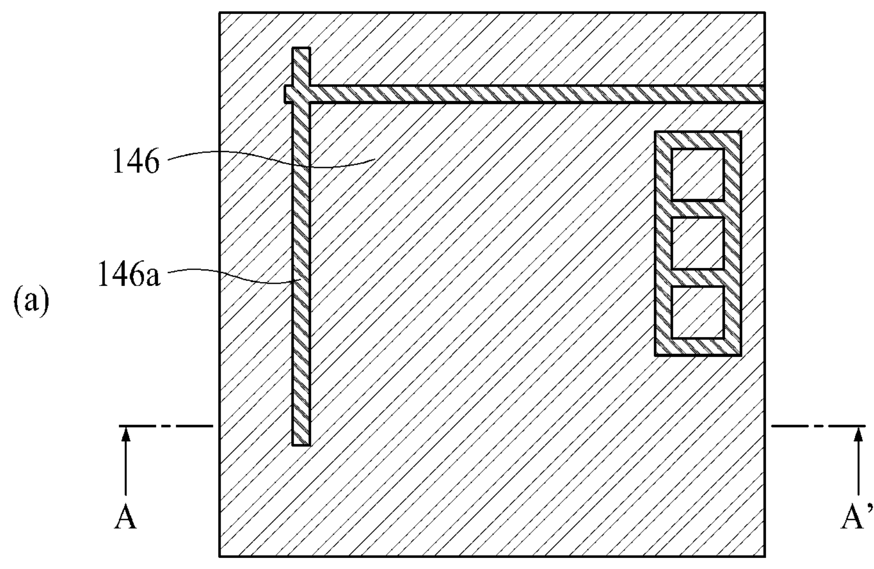
Figure 11:
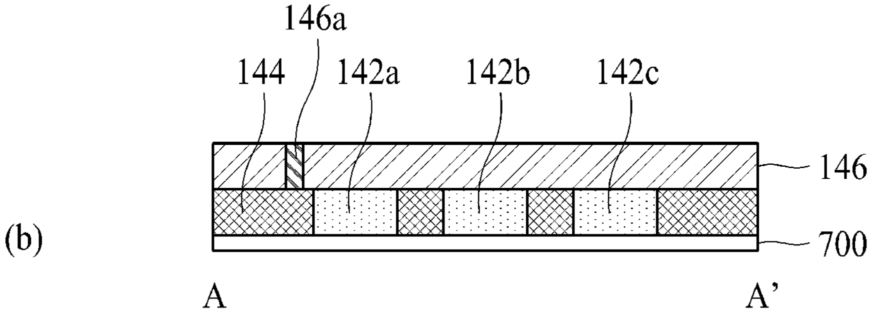

Thereafter, as shown in FIGS. 11(*a*) and 11(*b*), an upper wire rearrangement layer 146 may be formed on the upper surfaces of the second molding member 144 and the first semiconductor dies 142*a* to 142*f* The upper wire rearrangement layer 146 may include a plurality of first wires (not shown). In one embodiment, the upper wire rearrangement layer 146 may be formed through electroless plating and may be formed of a copper-based metal. The upper wire rearrangement layer 146 may be formed through a Re-Distribution Layer (RDL) process.

Among the first wires included in the upper wire rearrangement layer 146, the wires that are insulated from each other may be physically separated by the first insulating member 146*a*. In one embodiment, the first insulating member 146*a* may be formed of a Photo Resistor.

Figure 12:
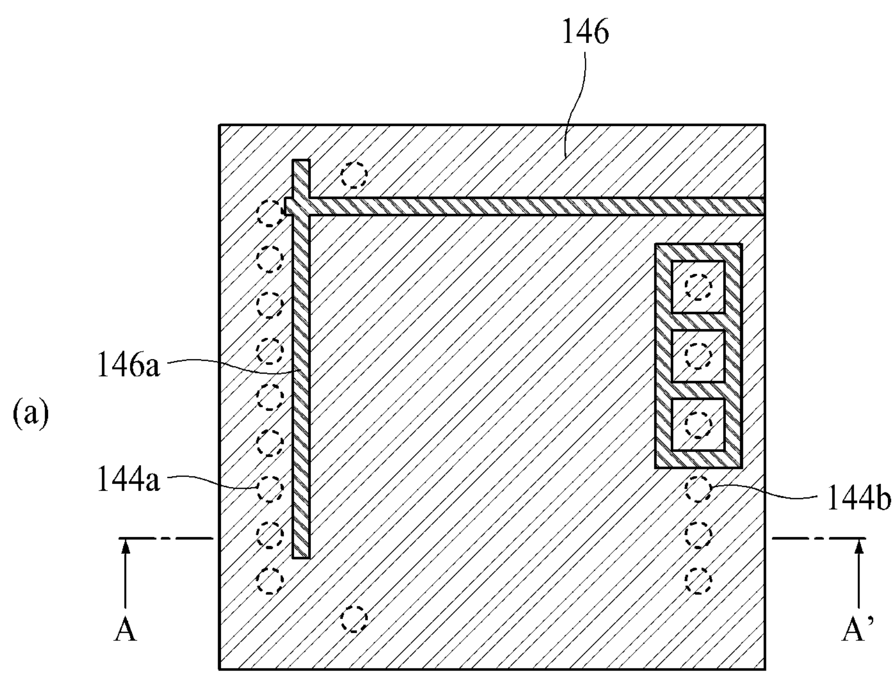
Figure 12:
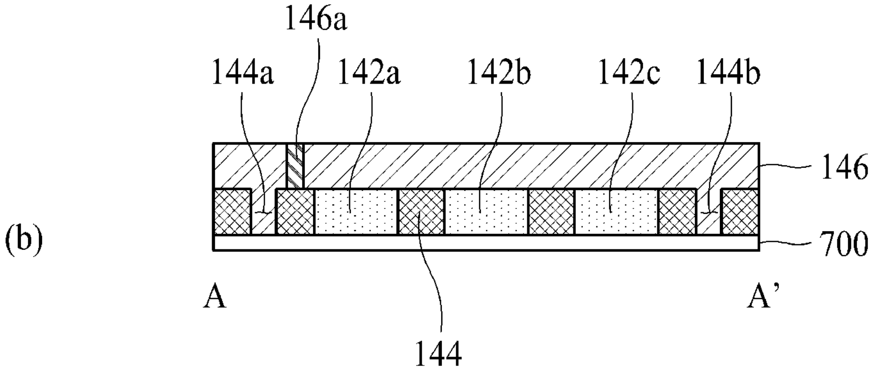

Then, as shown in FIGS. 12(*a*) and 12(*b*), a hole may be formed through the upper wire rearrangement layer 146 and the second molding member 144, and the via hole 144*a* may be formed by filling the hole with a conductive material. The via hole 144*a* may electrically connect some of the second wires included in the lower wire rearrangement layer 148, which will be described later, and some of the first wires included in the upper wire rearrangement layer 146.

Figure 13:
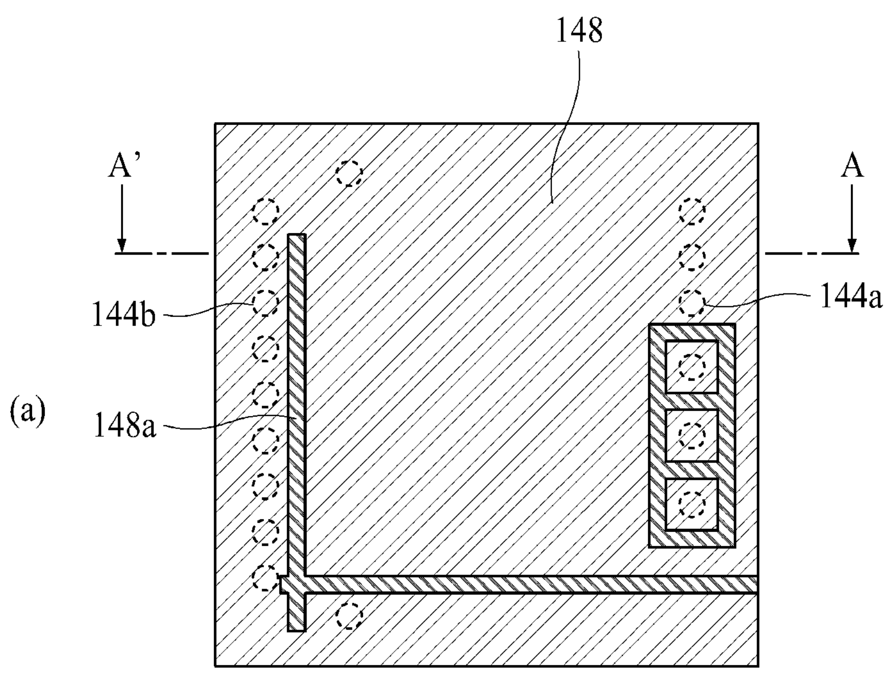
Figure 13:
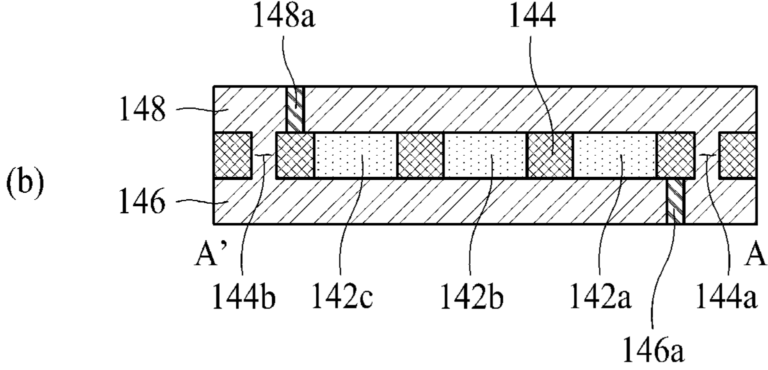

Thereafter, as shown in FIGS. 13(*a*) and 13(*b*), the first semiconductor die module 140 in process may be turned over so that the process side is reversed. At this time, the carrier film 700 may be removed. For convenience of explanation, FIG. 13(*a*) shows the lower side of the first semiconductor die module 140 in process.

As shown in FIGS. 13(*a*) and 13(*b*), a lower wire rearrangement layer 148 may be formed on the lower surfaces of the second molding member 144 and the first semiconductor dies 142*a* to 142*f* The lower wire rearrangement layer 148 may include a plurality of second wires (not shown). In one embodiment, the lower wire rearrangement layer 148 may be formed through electroless plating and may be formed of a copper-based metal. The lower wire rearrangement layer 148 may be formed through a Re-Distribution Layer (RDL) process.

Among the second wires included in the lower wire rearrangement layer 148, the wires that are insulated from each other may be physically separated by the second insulating member 148*a*. In one embodiment, the second insulating member 148*a* may be formed of a Photo Resistor.

In one embodiment, the process of forming the via hole 144*a* shown in FIGS. 12(*a*) and 12(*b*) described above may be performed after the process of forming the lower wire rearrangement layer 148 shown in FIGS. 13(*a*) and 13(*b*). That is, the via hole 144*a* may be formed by forming a hole penetrating the lower wire rearrangement layer 148 and the second molding member 144 and filling the hole with a conductive material. Some of the first wires included in the upper wire rearrangement layer 146 and some of the second wires included in the lower wire rearrangement layer 148 may be electrically connected through the via hole 144*a*.

The second semiconductor die module 150 may be manufactured through the same process as the process shown in FIGS. 9 to 13 described above.

Figure 14:
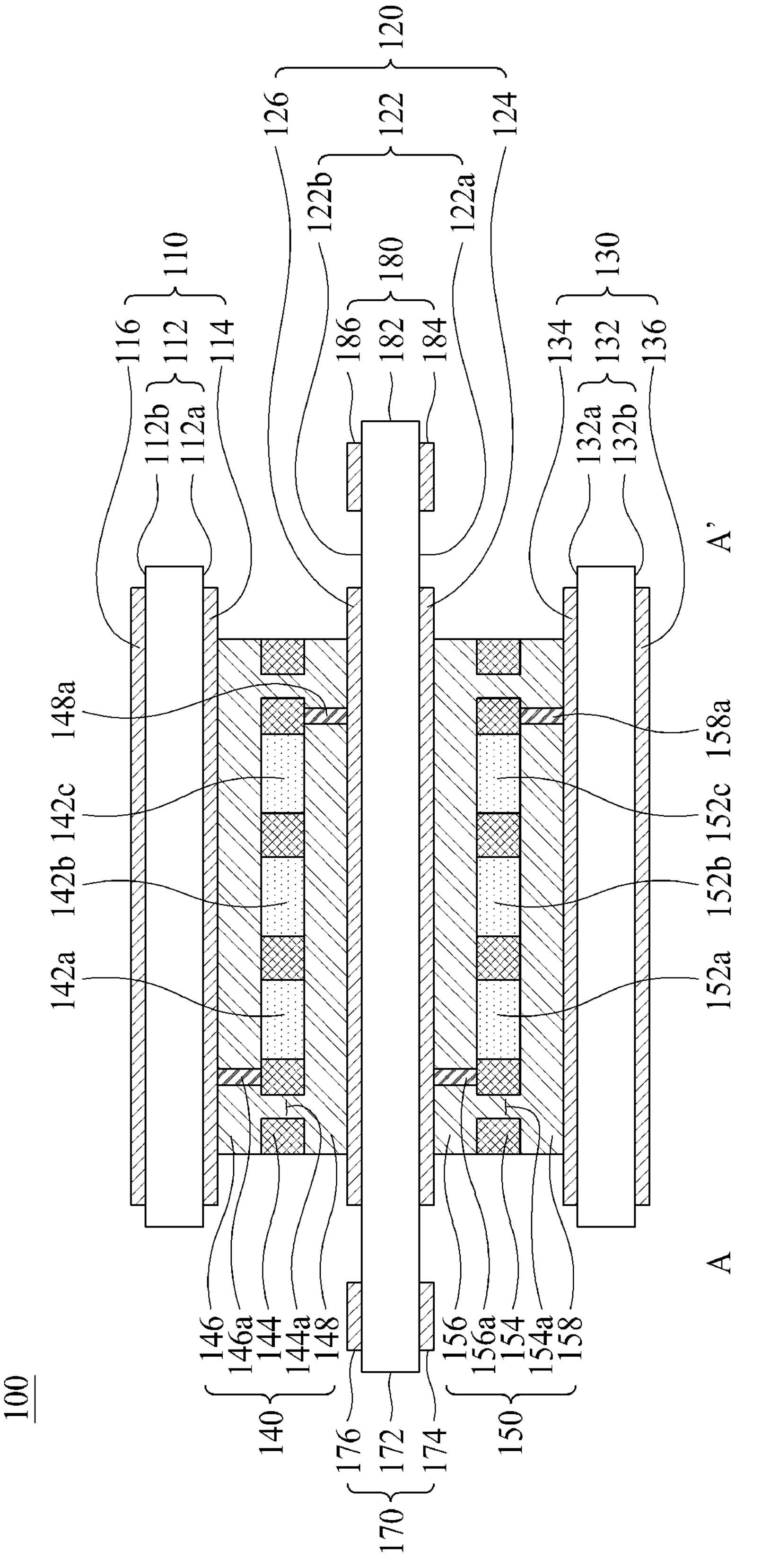

Afterwards, as shown in FIG. 14, the first semiconductor die module 140 may be mounted between the first heat dissipation substrate 110 and the second heat dissipation substrate 120, and the second heat dissipation substrate 120 and the second semiconductor module. In one embodiment, the first to third heat dissipation substrates 110, 120, and 130 may be manufactured using any one of DBC (Direct Bonded Copper), AMB (Active Metal Brazing), and DPC (Direct Plating Copper) methods.

Specifically, the second heat dissipation substrate 120 may is disposed below the first heat dissipation substrate 110, the third heat dissipation substrate 130 may is disposed below the second heat dissipation substrate 120, so that the first semiconductor die module 140 may be mounted between the first and second heat dissipation substrates 110 and 120, and the second semiconductor die module 150 may be mounted between the second and third heat dissipation substrates 120 and 130.

As shown in FIG. 14, the first heat dissipation substrate 110 may include a first base plate 112, a first metal wiring layer 114, and a first heat dissipation metal layer 116. The second heat dissipation substrate 120 may include a second base plate 122, a second metal wiring layer 124, and a third metal wiring layer 126. The third heat dissipation substrate 130 may include a third base plate 132, a fourth metal wiring layer 134, and a second heat dissipation metal layer 136.

Predetermined circuit wiring patterns may be formed in the first to fourth metal wiring layers 114, 124, 126, and 134, and heat dissipation means including a cooling medium may be disposed adjacent to the first and second heat dissipation metal layers 116 and 136.

In one embodiment, the first heat dissipation substrate 110 and the second heat dissipation substrate 120 may be coupled to the first semiconductor die module 140 through an adhesive member. Specifically, the first metal wiring layer 114 is bonded to the upper surface of the first semiconductor die module 140 through an adhesive member, and the second metal wiring layer 124 is bonded to the lower surface of the first semiconductor die module 140 through the adhesive member.

Additionally, the second heat dissipation substrate 120 and the third heat dissipation substrate 130 may be coupled to the second semiconductor die module 150 through the adhesive member. Specifically, the third metal wiring layer 126 is bonded to the upper surface of the second semiconductor die module 150 through an adhesive member, and the fourth metal wiring layer 134 is bonded to the lower surface of the second semiconductor die module 150 through the adhesive member.

In the above-described embodiment, the adhesive member may be a Sn—Ag-based adhesive member or an Ag-based adhesive member. At this time, the first heat dissipation substrate 110 and the second heat dissipation substrate 120 may be coupled to the first semiconductor die module 140 through a soldering process or a sintering process, and the second heat dissipation substrate 120 and the third heat dissipation substrate 130 may be coupled to the second semiconductor die module 150 through a soldering process or a sintering process.

Meanwhile, in the above-described embodiment, in the case of the first heat dissipation substrate 110 and the third heat dissipation substrate 130, the first heat dissipation metal layer 116 and the second heat dissipation metal layer 136 may be exposed to the outside. However, since the second heat dissipation substrate 120 may is disposed between the first heat dissipation substrate 110 and the third heat dissipation substrate 130, the second heat dissipation substrate 120 cannot be exposed to the outside, so unlike the first heat dissipation substrate 110 and the third heat dissipation substrate, heat dissipation performance may be reduced. Therefore, in order to improve the heat dissipation performance of the second heat dissipation substrate 120, the present invention may additionally include a first auxiliary heat dissipation substrate 170 and a second auxiliary heat dissipation substrate 180, as shown in FIG. 14.

In one embodiment, the first auxiliary heat dissipation substrate 170 and the second auxiliary heat dissipation substrate 180 may be formed integrally with the second heat dissipation substrate 120, and according to this embodiment, the first auxiliary heat dissipation substrate 170 and the second auxiliary heat dissipation substrate 180 may be formed together with the second heat dissipation substrate 120 when the second heat dissipation substrate 120 is manufactured.

The first auxiliary heat dissipation substrate 170 may extend from one side of the second heat dissipation substrate 120 to the outside of the first molding member 160, which will be described later, and the second auxiliary heat dissipation substrate 180 may extend from the other side of the heat dissipation substrate 120 to the outside of the first molding member, thereby improving the heat dissipation performance of the second heat dissipation substrate 120.

The first auxiliary heat dissipation substrate 170 may include a first auxiliary base plate 172, a first auxiliary heat dissipation metal layer 174, and a second auxiliary heat dissipation metal layer 176, and the second auxiliary heat dissipation substrate 180 may include a second auxiliary base plate 182, a third auxiliary heat dissipation metal layer 184, and a fourth auxiliary heat dissipation metal layer 186.

The first auxiliary base plate 172 and the second auxiliary base plate 182 may be formed integrally with the second base plate 122. The first auxiliary base plate 172 may be formed by extending from one side of the second base plate 122 in the outward direction of the first molding member 160, and the second auxiliary base plate 182 may be formed by extending from the other side of the second base plate 122 in the outward direction of the first molding member 160.

The first to fourth auxiliary heat dissipation metal layers 174, 176, 184, and 186 may be exposed to the outside of the first molding member 160, thereby dissipating heat to the outside. Heat dissipation means including a cooling medium may be disposed adjacent to the first to fourth auxiliary heat dissipation metal layers 174, 176, 184, and 186.

In the above-described embodiment, the first auxiliary heat dissipation substrate 170 and the second auxiliary heat dissipation substrate 180, among the four sides of the second heat dissipation substrate 120, the side on which the lead frames 190 and 195 are not formed may extend to the outside of the first molding member 160.

As such, in the case of the present invention, it may include a first auxiliary heat dissipation substrate 170 and a second auxiliary heat dissipation substrate 180 formed to be exposed to the outside of the first molding member 160, and since heat dissipation means including a cooling medium can be additionally disposed on the first auxiliary heat dissipation substrate 170 and the second auxiliary heat dissipation substrate 180, the heat dissipation performance of the stacked semiconductor module 100 can be maximized.

Figure 15:
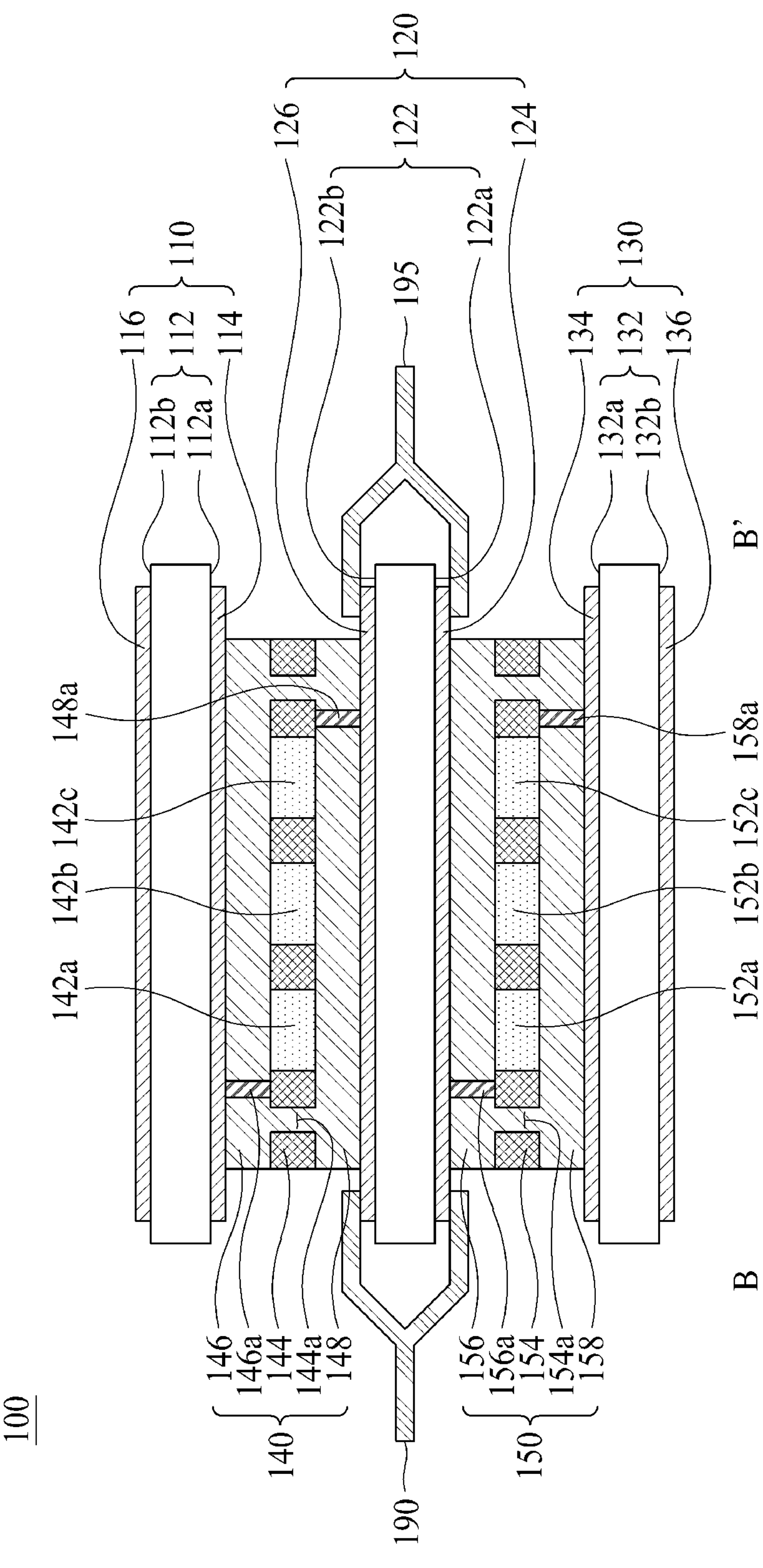

Thereafter, as shown in FIG. 15, lead frames 190 and 195 may be disposed, one end of which is connected to one side and the other side of the second heat dissipation substrate 120, and the other end of which is connected to an external input terminal. At this time, the lead frames 190 and 195 are connected to one side and the other side of the second heat dissipation substrate 120 on the side of the four sides of the second auxiliary heat dissipation substrate 180 where the first auxiliary heat dissipation substrate 170 and the second auxiliary heat dissipation substrate 180 are not extend.

Figure 16A:
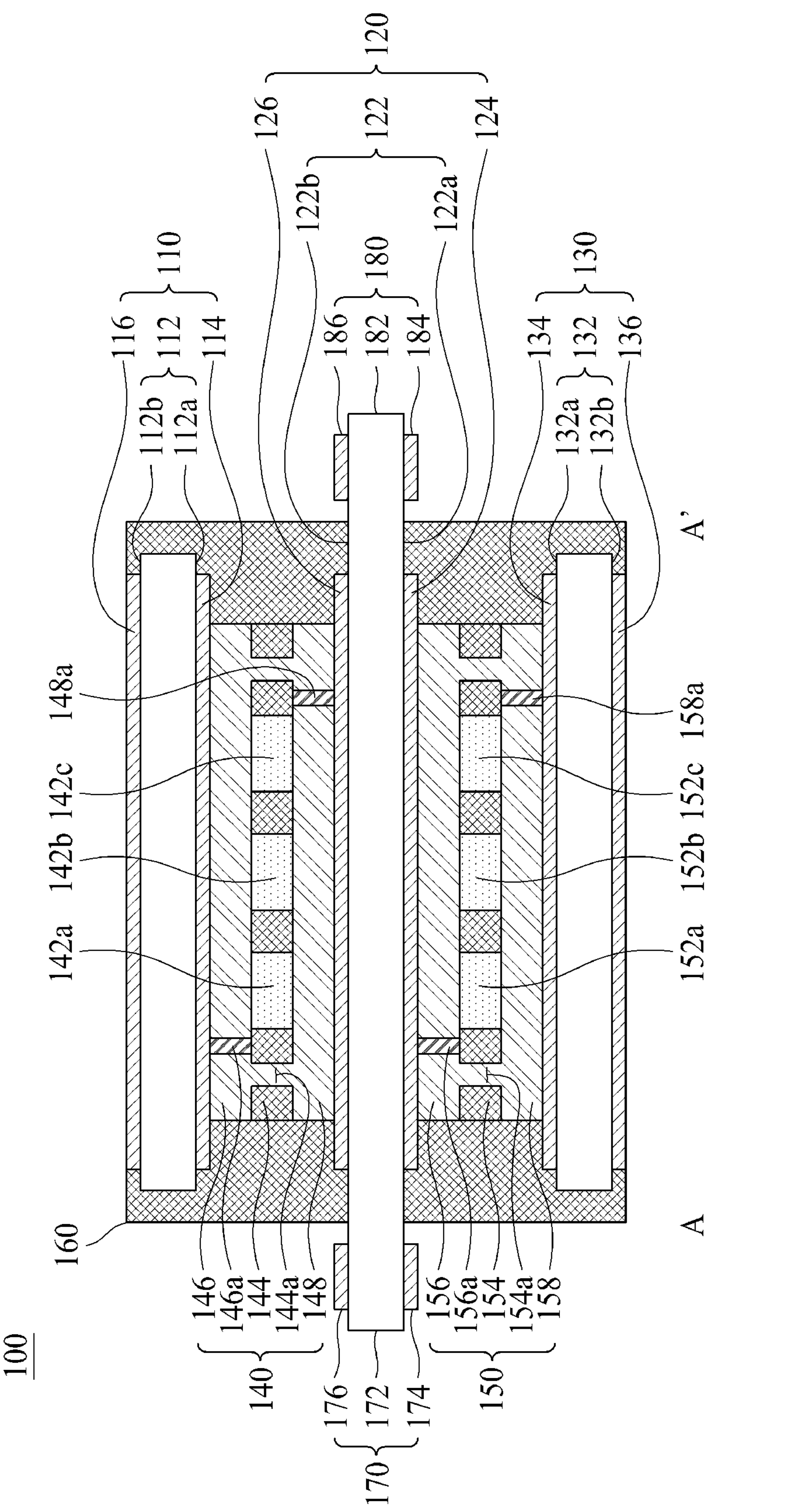
Figure 16B:
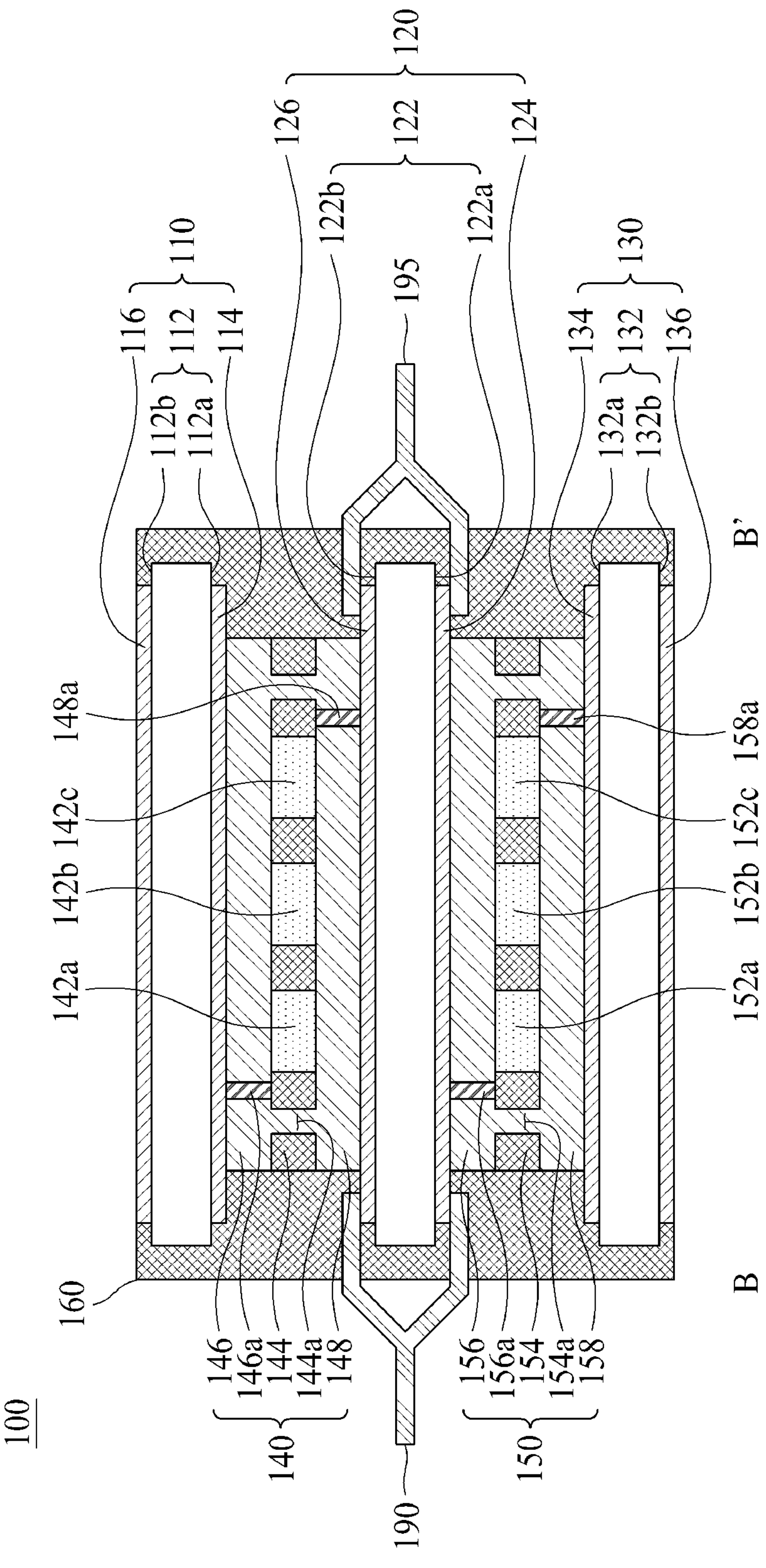

Thereafter, as shown in FIGS. 16A and 16B, the first molding member 160 may be formed by injecting a molding material into the space between the first heat dissipation substrate 110 and the second heat dissipation substrate 120 and the space between the second heat dissipation substrate 120 and the third heat dissipation substrate 130. The molding material may consist of EMC.

Hereinafter, a method of manufacturing a stacked semiconductor module with a double-sided heat dissipation structure according to the second embodiment of the present invention will be described with reference to FIG. 17.

FIG. 17 is a schematic cross-sectional process drawing showing a method of manufacturing a stacked semiconductor module with a double-sided heat dissipation structure according to the second embodiment of the present invention.

Figure 17A:
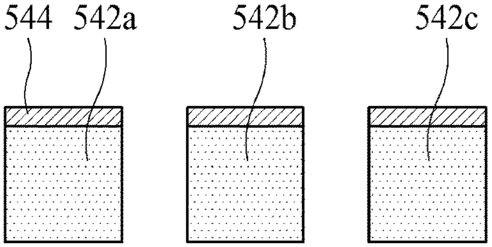
FIGS. 17A to 17F are drawings showing a method of manufacturing a stacked semiconductor module with a double-sided heat dissipation structure according to a second embodiment of the present invention.

First, as shown in FIG. 17A, the first semiconductor die module 540 is manufactured by coupling the first spacer 544 to one surface of the first semiconductor die 542*a* to 542*c*. The first spacer 544 may be formed using copper-molybdenum (Cu—Mo).

In one embodiment, the first spacer 544 may be coupled to one surface of the first semiconductor die 542*a* to 542*c* through an adhesive member. In one embodiment, the adhesive member may be a Sn—Ag based adhesive member or an Ag based adhesive member, and the first spacer 544 may be coupled to the first semiconductor dies 542*a* to 542*c* through a soldering process or a sintering process.

Meanwhile, the second semiconductor die module 550 is manufactured through the same process as shown in FIG. 17A.

Figure 17B:
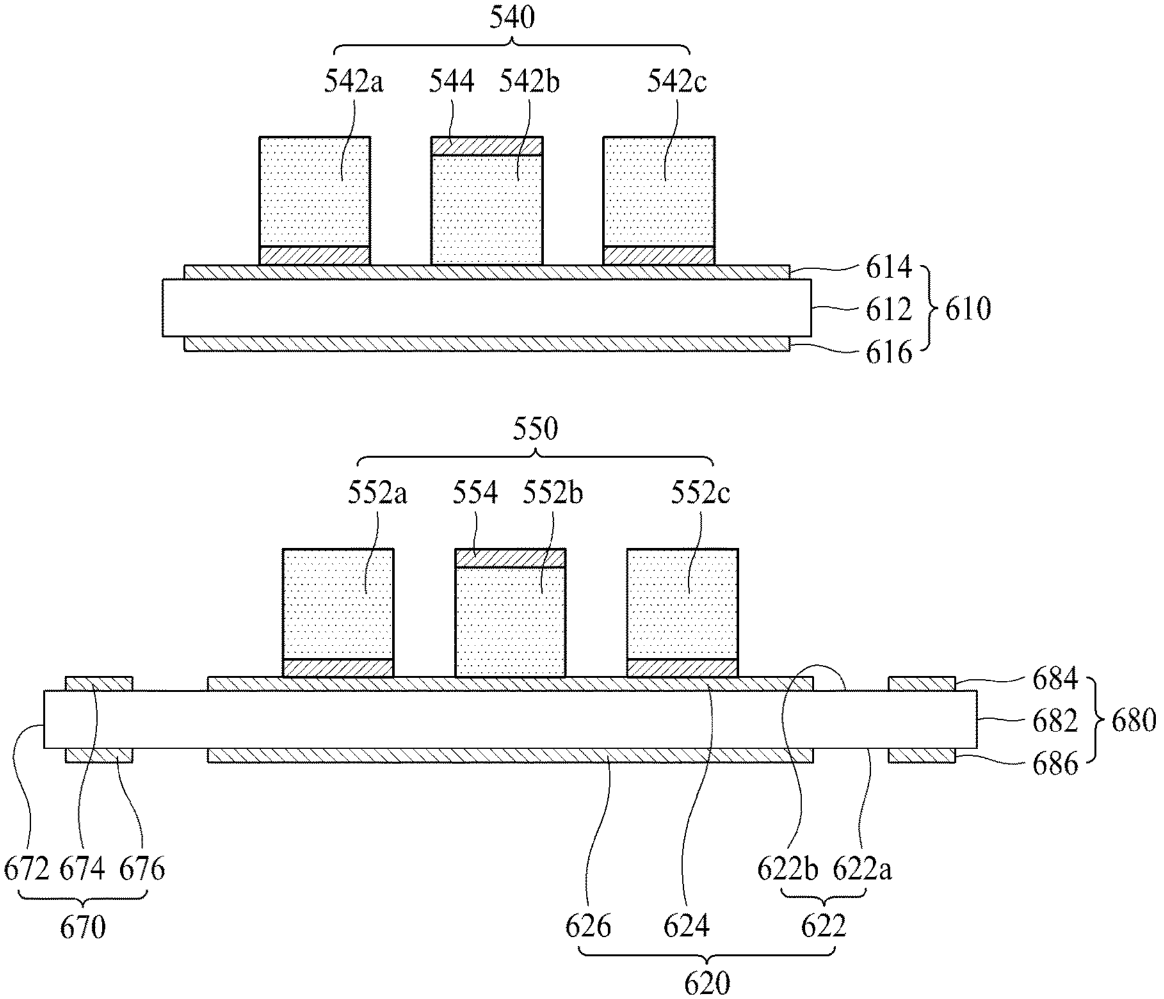

Thereafter, as shown in FIG. 17B, the first semiconductor die module 540 may be coupled to the first heat dissipation substrate 610, and the second semiconductor die module 550 may be coupled to the second heat dissipation substrate 620. At this time, as shown in FIG. 17B, some of the first semiconductor die module 540 and the second semiconductor die module 550 may be arranged so that the first or second spacers 544 and 554 are located on the upper surface, and the remaining some may be arranged so that the first or second spacers 544 and 554 are located on the lower surface. In another embodiment, the first semiconductor die module 540 and the second semiconductor die module 550 are all arranged in the same direction so that the first or second spacers 544 and 554 are located on the upper surface, or the first or second spacers 544 and 554 may all be arranged in the same direction so that they are located on the lower surface.

In one embodiment, the first heat dissipation substrate 610 may include a first base plate 612, a first metal wiring layer 614, and a first heat dissipation metal layer 616, and a second heat dissipation substrate 620 may include a second base plate 622, a second metal wiring layer 624, and a third wiring metal layer 626. According to this embodiment, the first semiconductor die module 540 may be coupled to the first metal wiring layer 614 of the first heat dissipation substrate 610 through an adhesive member, and the second semiconductor die module 550 may be coupled to the second metal wiring layer 624 of the second heat dissipation substrate 620 through the adhesive member. In one embodiment, the adhesive member may be a Sn—Ag based adhesive member or an Ag based adhesive member, and the first and second semiconductor die modules 540 and 550 may be respectively coupled to the first and second heat dissipation substrates 610 and 620 through a soldering process or a sintering process.

Meanwhile, the stacked semiconductor module shown in FIG. 17B also may include a first auxiliary heat dissipation substrate 670 and a second auxiliary heat dissipation substrate 680 extending from the second heat dissipation substrate 620 to increase the heat dissipation area of the second heat dissipation substrate 620, as in the first embodiment. Since the first and second auxiliary heat dissipation substrates 670 and 680 are the same as those shown in FIG. 14, detailed description will be omitted.

Figure 17C:
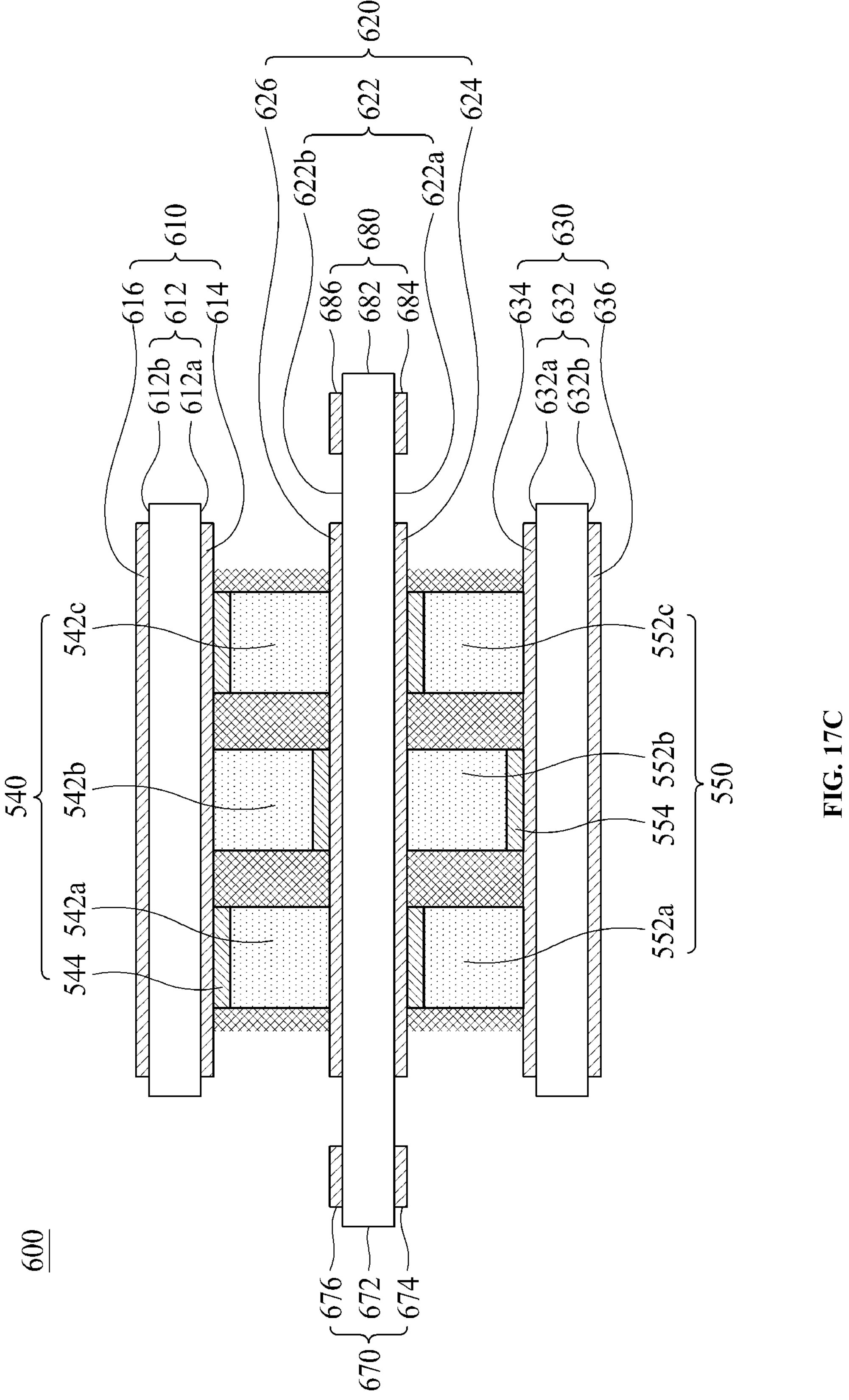

Thereafter, as shown in FIG. 17C, the first heat dissipation substrate 610 to the third heat dissipation substrate 630 are coupled so that the first semiconductor die module 540 is interposed between the first heat dissipation substrate 610 and the second heat dissipation substrate 620, and the second semiconductor module 650 is interposed between the second heat dissipation substrate 620 and the third heat dissipation substrate 630. In one embodiment, the first to third heat dissipation substrates 610, 620, and 630 may be formed using any one of DBC (Direct Bonded Copper), AMB (Active Metal Brazing), and DPC (Direct Plating Copper) methods.

Figure 17D:
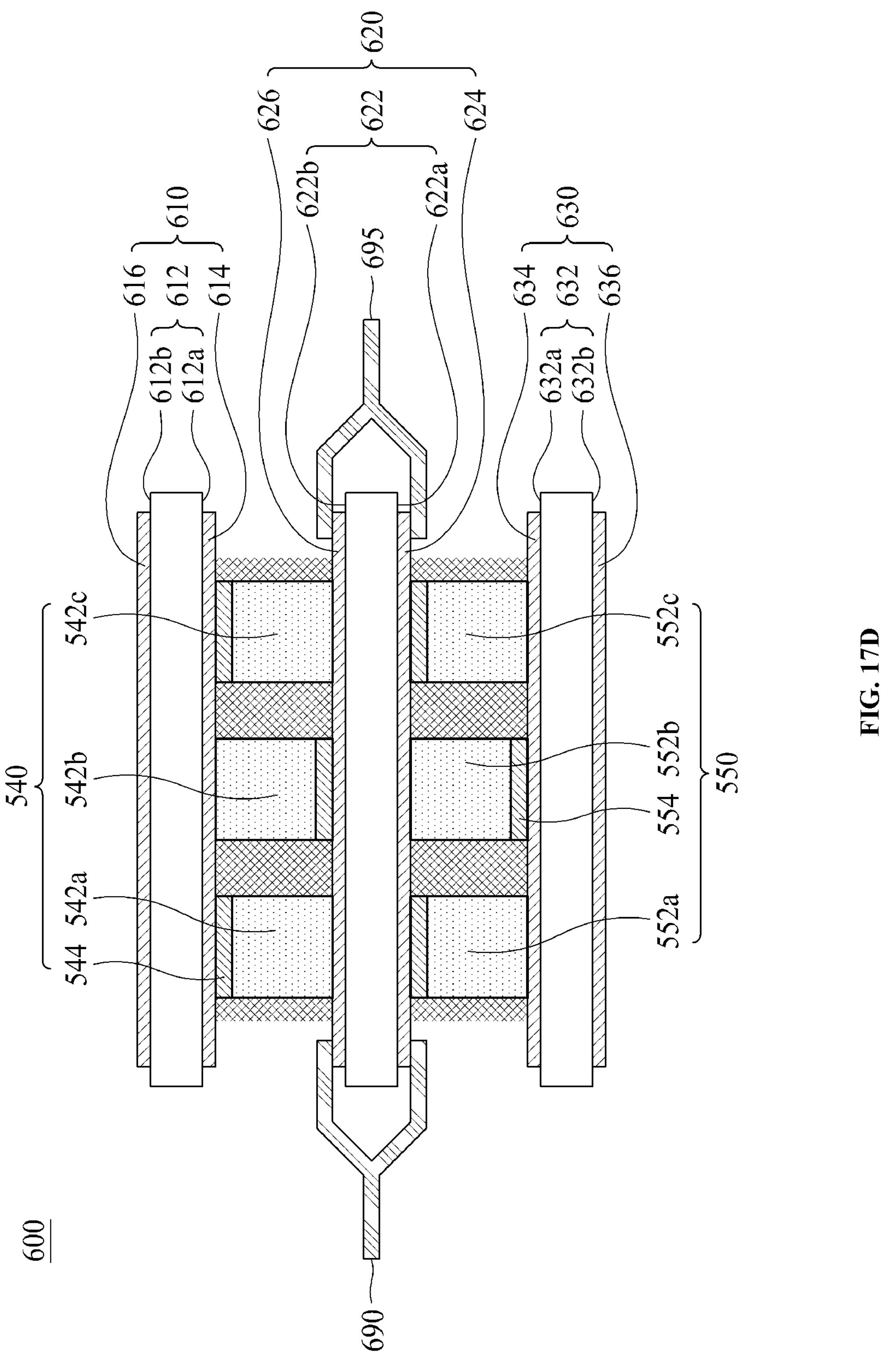

Thereafter, as shown in FIG. 17D, Lead frames 690 and 695 may be disposed, one end of which is connected to one side and the other side of the second heat dissipation substrate 620, and the other end of which is connected to an external input terminal. At this time, the lead frames 690 and 695 are connected to one side and the other side of the second heat dissipation substrate 620 at the side where the first auxiliary heat dissipation substrate 670 and the second auxiliary heat dissipation substrate 680 are not extend among the four sides of the second heat dissipation substrate 620.

Figure 17E:
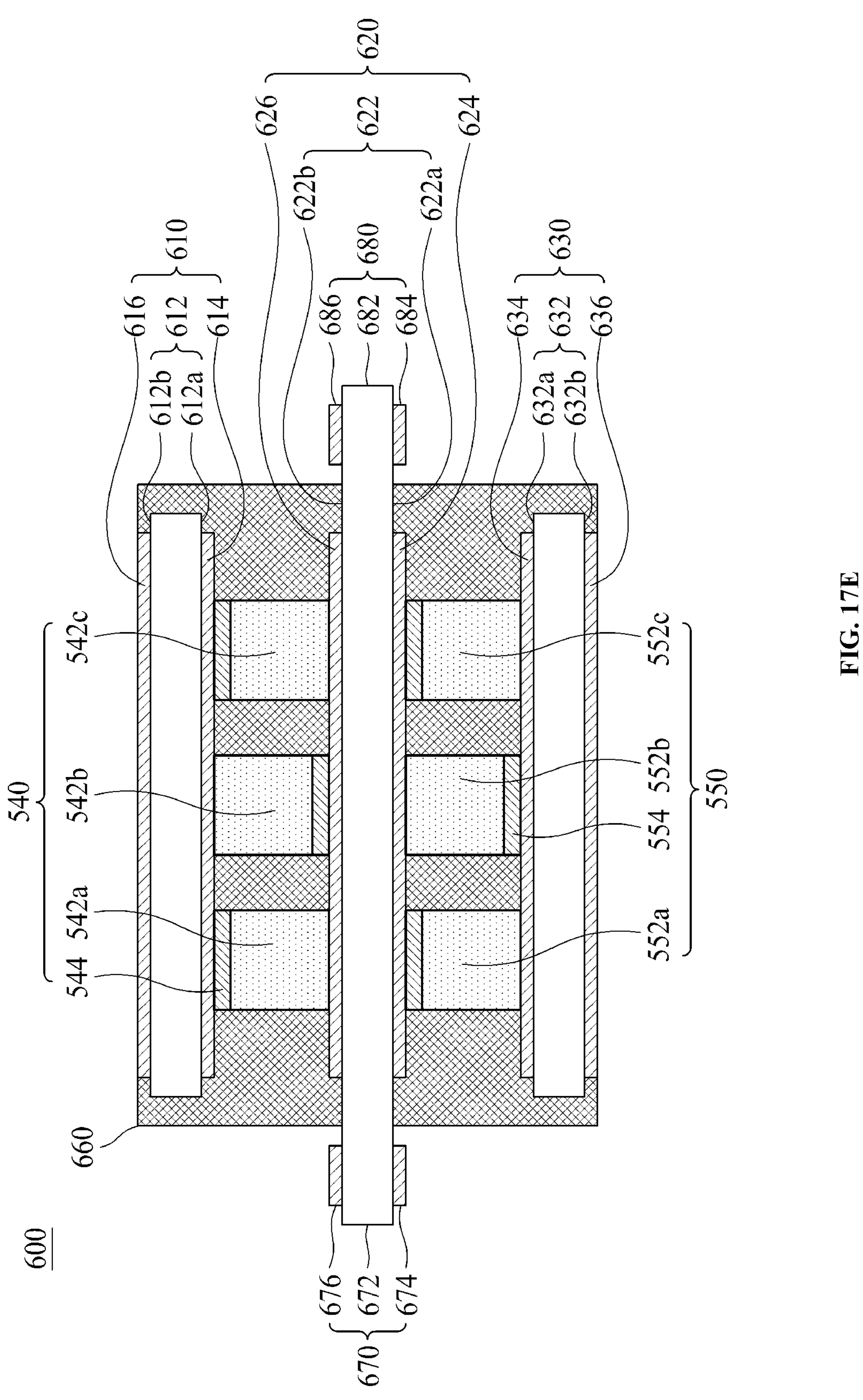
Figure 17F:
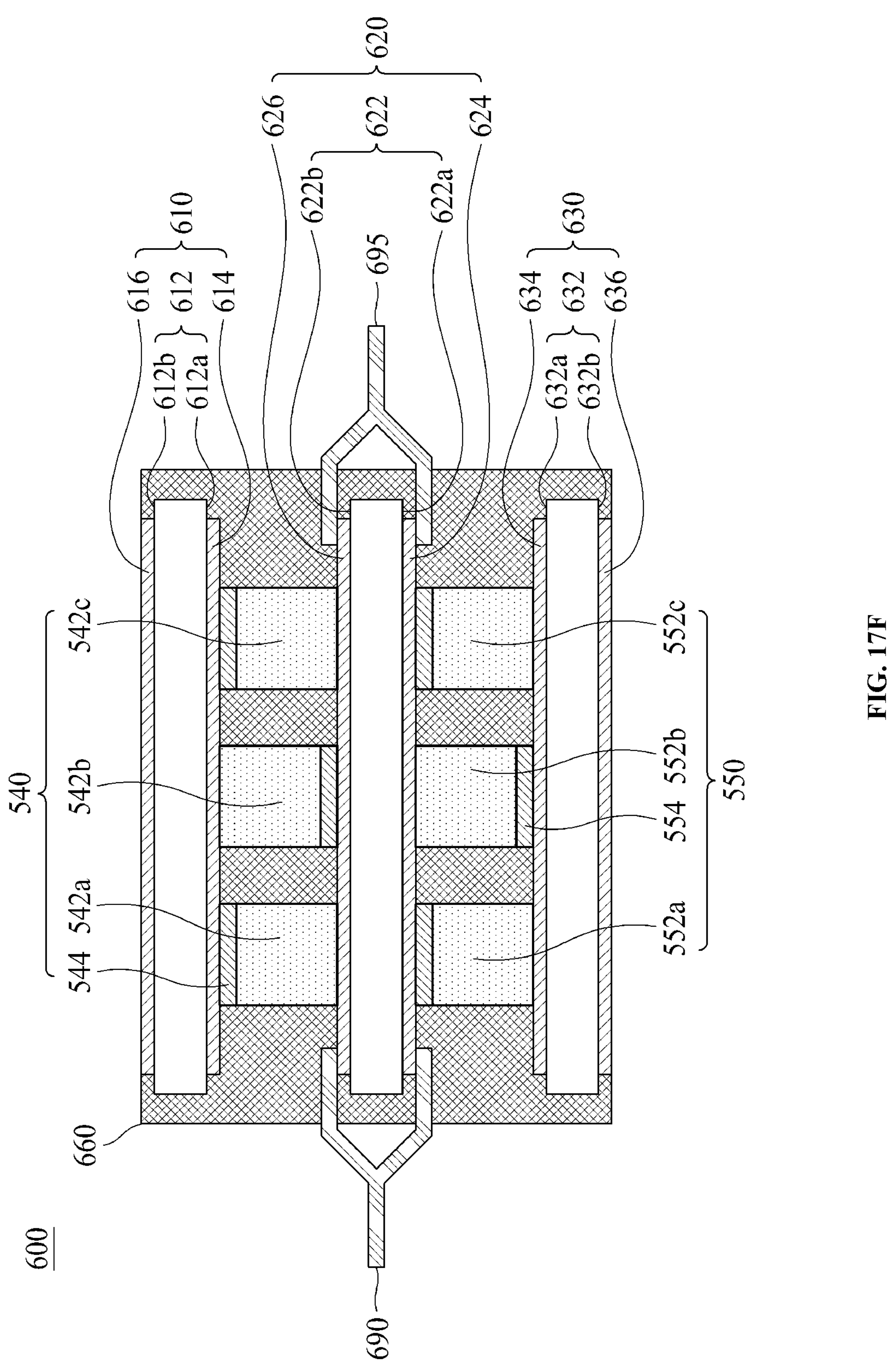

Thereafter, as shown in FIGS. 17E and 17F, the first molding member 660 may be formed by injecting a molding material between the space between the first heat dissipation substrate 610 and the second heat dissipation substrate 620 and the second heat dissipation substrate 620 and the third heat dissipation substrate 630 The molding material may consist of EMC.

Those skilled in the art to which the present invention pertains will understand that the above-described present invention can be implemented in other specific forms without changing its technical idea or essential features.

Therefore, the embodiments described above should be understood in all respects as illustrative and not restrictive. The scope of the present invention is indicated by the claims described below rather than the detailed description above, and all changes or modified forms derived from the meaning and scope of the claims and their equivalent concepts should be construed as being included in the scope of the present invention.

What is claimed is:

1. A stacked semiconductor module having a double-sided heat dissipation structure comprising:

a first heat dissipation substrate;

a second heat dissipation substrate disposed below the first heat dissipation substrate to face the first heat dissipation substrate;

a first semiconductor die module mounted between the first heat dissipation substrate and the second heat dissipation substrate;

a third heat dissipation substrate disposed below the second heat dissipation substrate to face the second heat dissipation substrate; and a second semiconductor die module mounted between the second heat dissipation substrate and the third heat dissipation substrate.

2. The stacked semiconductor module according to claim 1, further comprising:

a first molding member disposed in a first space between the first heat dissipation substrate and the second heat dissipation substrate and a second space between the second heat dissipation substrate and the third heat dissipation substrate;

a first auxiliary heat dissipation substrate extending from one side of the second heat dissipation substrate to an outside of the first molding member; and a second auxiliary heat dissipation substrate extending from another side of the second heat dissipation substrate to the outside of the first molding member.

3. The stacked semiconductor module according to claim 2, further comprising:

a lead frame having one end of the lead frame electrically connected to a first surface of the second heat dissipation substrate and a second surface opposite to the first surface, and the other end of the lead frame exposed to the outside of the first molding member, wherein the first and second auxiliary heat dissipation substrates extend from the second heat dissipation substrate in a region of the second heat dissipation substrate that is not connected to the lead frame.

4. The stacked semiconductor module according to claim 2, wherein each of the first to the third heat dissipation substrates, and the first and the second auxiliary heat dissipation substrates comprises:

a base plate;

a first metal layer disposed on a first surface of the base plate; and a second metal layer disposed on a second surface of the base plate, and wherein a circuit wire having a predetermined pattern is disposed in the first metal layers of the first and third heat dissipation substrates and the first and second metal layers of the second heat dissipation substrate, and a cooling medium disposed on the second metal layers of the first and third heat dissipation substrates and the first and second metal layers of the first and second auxiliary heat dissipation substrates.

5. The stacked semiconductor module according to claim 1, wherein the first semiconductor die module comprises one or more first semiconductor dies and a first spacer disposed between the one or more first semiconductor dies and the second heat dissipation substrate, and wherein the second semiconductor die module comprises one or more second semiconductor dies and a second spacer disposed between the one or more second semiconductor dies and the third heat dissipation substrate.

6. The stacked semiconductor module according to claim 1, wherein each of the first semiconductor die module and the second semiconductor die module comprises:

at least one semiconductor die;

a second molding member disposed to expose upper and lower surfaces of the semiconductor die and to surround side surfaces of the semiconductor die;

a first wire rearrangement layer disposed on the second molding member and the upper surface of the semiconductor die; and a second wire rearrangement layer disposed on a lower surface of the second molding member and the lower surface of the semiconductor die.

7. The stacked semiconductor module according to claim 6, wherein a via hole filled with a conductive material is disposed in the second molding member, and wherein the first wire rearrangement layer and the second wire rearrangement layer are electrically connected to each other through the via hole.

8. The stacked semiconductor module according to claim 6, wherein the second molding member comprises an EMC (Epoxy Molding Compound).

9. The stacked semiconductor module according to claim 6, wherein each the first wire rearrangement layer and the second wire rearrangement layer comprises a copper-based metal.

10. The stacked semiconductor module according to claim 1, wherein a first semiconductor die disposed in the first semiconductor die module is mounted in a first area between the first heat dissipation substrate and the second heat dissipation substrate, and a second semiconductor die disposed in the second semiconductor die module is mounted in the first area between the second heat dissipation substrate and the third heat dissipation substrate, and wherein the first semiconductor die and the second semiconductor die are formed in a stacked structure.

11. The stacked semiconductor module according to claim 1, wherein each of the first semiconductor die module and the second semiconductor die module comprises at least one semiconductor die, and wherein a gate electrode and a source electrode electrically isolated from the gate electrode are disposed on a first side of the semiconductor die, and a drain electrode is disposed on a second side of the semiconductor die.

12. The stacked semiconductor module according to claim 1, wherein each semiconductor die included in the first semiconductor die module and the second semiconductor die module comprises a power semiconductor device.

13. The stacked semiconductor module according to claim 1, further comprising a molding member, wherein the molding member is in direct physical contact with side surfaces of each of a plurality of semiconductor die modules.

14. The stacked semiconductor module according to claim 1, further comprising a molding member, wherein the molding member mechanically couples adjacent semiconductor die modules to each other to form a single integrated structural body.

15. The stacked semiconductor module according to claim 1, further comprising a molding member, wherein the molding member extends continuously across an entire gap region defined between two adjacent semiconductor die modules.

16. The stacked semiconductor module according to claim 1, further comprising a molding member, wherein a top surface of the molding member is substantially coplanar with a top surface of each of a plurality of semiconductor die modules.

17. The stacked semiconductor module according to claim 1, further comprising a molding member, wherein the molding member comprises an epoxy-based resin including inorganic filler particles configured to reduce thermal expansion mismatch between the semiconductor die modules and the substrate.

18. The stacked semiconductor module according to claim 1, wherein each semiconductor die module comprises a semiconductor die and a die attach layer disposed between the semiconductor die and the substrate.

19. The stacked semiconductor module according to claim 1, further comprising a molding member, wherein the molding member is disposed only in a region between adjacent semiconductor die modules and is absent from an outer peripheral region of the substrate.

20. The stacked semiconductor module according to claim 1, further comprising a molding member, wherein the molding member is configured to distribute mechanical stress generated by thermal cycling across a plurality of semiconductor die modules through structural integration with side surfaces of the plurality of semiconductor die modules.

* * * * *